(12) United States Patent
Takahashi

(10) Patent No.: US 7,391,800 B2
(45) Date of Patent: Jun. 24, 2008

(54) VERTICAL CAVITY SURFACE-EMITTING SEMICONDUCTOR LASER DEVICE, OPTICAL TRANSMISSION MODULE, OPTICAL TRANSMISSION DEVICE, AND OPTICAL SWITCHING METHOD

(75) Inventor: Takashi Takahashi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/344,421

(22) Filed: Feb. 1, 2006

(65) Prior Publication Data
US 2006/0171437 A1 Aug. 3, 2006

(30) Foreign Application Priority Data
Feb. 2, 2005 (JP) ............................... 2005-026469
Mar. 7, 2005 (JP) ............................... 2005-062294

(51) Int. Cl.
*H01S 5/00* (2006.01)
(52) U.S. Cl. .................. 372/50.1; 372/43.01; 372/45.01; 372/45.011; 372/45.013; 372/50.124
(58) Field of Classification Search ............. 372/45.01, 372/46.01, 50, 43.01, 45.013, 50.1, 50.124
See application file for complete search history.

(56) References Cited
U.S. PATENT DOCUMENTS 5,408,486 A * 4/1995 Shoji ....................... 372/45.01
6,049,556 A * 4/2000 Sato ........................ 372/46.01
6,300,650 B1 * 10/2001 Sato ............................ 257/184
6,803,604 B2 * 10/2004 Takahashi et al. ............. 257/80
2004/0065888 A1 * 4/2004 Sato et al. ..................... 257/79

FOREIGN PATENT DOCUMENTS

| JP | 5-63301 A | 3/1993 |
| JP | 5-152674 A | 6/1993 |
| JP | 2003-205529 A | 7/2003 |

OTHER PUBLICATIONS

A. J. Fisher, et al., "Q-Switched Operation of a Coupled-Resonator Vertical-Cavity Laser Diode," Appl. Phys. Lett., vol. 76, (2000), pp. 1975-1977.

* cited by examiner

*Primary Examiner*—Minsun Harvey
*Assistant Examiner*—Yuanda Zhang
(74) *Attorney, Agent, or Firm*—Dickstein Shapiro LLP

(57) ABSTRACT

In a vertical cavity surface-emitting semiconductor laser device, first and second resonance wavelengths which are different are provided while a first resonator and a second resonator are coupled optically, and a gain of an active layer at the first resonance wavelength on the side of short wavelength is higher than that at the second resonance wavelength on the side of long wavelength. An absorption coefficient of an optical absorption layer when no electric field is applied is small for the first and second resonance wavelengths, and when an electric field is applied, an absorption coefficient of the optical absorption layer for the first resonance wavelength on the side of short wavelength is larger than that for the second resonance wavelength on the side of long wavelength.

13 Claims, 23 Drawing Sheets

VERTICAL CAVITY SURFACE-EMITTING SEMICONDUCTOR LASER DEVICE, OPTICAL TRANSMISSION MODULE, OPTICAL TRANSMISSION DEVICE, AND OPTICAL SWITCHING METHOD

BACKGROUND OF THE INVENTION

1. Field of the Invention

The present invention relates to a vertical cavity surface-emitting semiconductor laser device, an optical transmission module, an optical transmission device, and an optical switching method.

2. Description of the Related Art

In recent years, the optical transmission technology has been developed to not only the trunk-system transmission network but also LAN, the access system and the home network. For example, in the Ethernet, the data-transmission capacity of 10 Gbps has been developed. In the future, a further increase in the data-transmission capacity is demanded, and an optical transmission system with the transmission capacity of over 10 Gbps is expected.

In the light source for optical transmission the data-transmission capacity of which is 10 Gbps or less, a direct modulation method which modulates the output light intensity by modulating the introducing current of a semiconductor laser is mainly used.

However, it is difficult to operate the existing semiconductor laser at a modulation frequency exceeding 10 GHz by using the direct modulation method.

To overcome the problem, the system which modulates the light outputted from the semiconductor laser by using an external modulator is developed for a light source for optical transmission with the transmission capacity of over 10 Gbps.

However, in the case of the external modulator system, the module size is large, the number of parts needed is also large, and there is a problem that the external modulator system is expensive. Therefore, even if the optical transmission technology employing the external modulator can be used for an expensive system such as the trunk system, it is unsuitable for the systems used by the ordinary users, such as LAN systems or home network systems.

A vertical cavity surface-emitting semiconductor laser device (VCSEL) is increasingly used as a light source for LAN or optical interconnection system. When compared with the conventional end-face emitting type semiconductor laser, this VCSEL has a low power consumption, and the cleavage at the manufacturing process is unnecessary. The inspection of the elements of the VCSEL in the wafer state is also possible, and the VCSEL is excellent in promoting low cost production.

Therefore, the VCSEL using the direct modulation is expected as a light source for large-capacity optical LAN and optical interconnection with the transmission capacity of over 10 Gbps.

Conventionally, some methods for modulating VCSEL at high speed are disclosed in Japanese Laid-Open Patent Application No.05-152674, Japanese Laid-Open Patent Application No.2003-202529, Japanese Laid-Open Patent Application No.05-063301, and Appl. Phys. Lett. vol. 76, pp. 1975-1977 (2000).

Namely, Japanese Laid-Open Patent Application No.05-152674 discloses a surface-emitting laser in which an optical absorption layer is provided in the middle of the upper multilayer film reflector of a VCSEL. This surface-emitting laser is provided with an external modulator which applies a reverse bias to the optical absorption layer to change an absorption coefficient of the external modulator. In the surface-emitting laser, a laser light beam is emitted by supplying a steady current to an active layer, and the rate of optical absorption of the external modulator is changed, so that the output light is turned on and off.

Japanese Laid-Open Patent Application No.2003-202529 discloses a laser device in which an optical absorption layer in the form of multiple quantum well structure is provided in a resonator of a VCSEL. A reverse bias is applied to the optical absorption layer, and an optical absorption coefficient is changed. Thereby, the internal absorption loss of the VCSEL is changed, and the oscillation threshold is changed. Even when a fixed current is supplied to the active layer, the laser light output intensity can be modulated greatly.

Appl. Phys. Lett. vol. 76, pp. 1975-1977 (2000), entitled "Q-switched Operation of a Coupled-Resonator Verical-Cavity Laser Diode", discloses a coupled-resonator vertical-cavity surface-emitting laser device (VCSEL). In this VCSEL, an active layer is provided in one of the two resonators, and a GaAs absorption layer is provided in the other resonator. A direct current is supplied to the active layer and a reverse bias is applied to the GaAs absorption layer, so that the laser light output intensity is modulated at 2 GHz (optical switching).

Japanese Laid-Open Patent Application No.05-063301 discloses a laser device in which a refractive index of one of a pair of distribution Bragg reflectors (DBR) of a VCSEL is changed by electric field or carrier introducing, or optical introducing, and the resonance wavelength of the distribution Bragg reflectors is changed and the wavelength difference between the resonance wavelength of the distribution Bragg reflectors and the optical emission wavelength is changed, so that laser light output intensity is modulated at high speed.

In the laser device of Japanese Laid-Open Patent Application No.05-152674, the multilayer film reflectors are provided on the upper and lower sides of the optical absorption layer, and the rate of the absorption of light is increased according to the resonance effect, and the modulation is performed. If the wavelength of the light is in agreement with the resonance wavelength, the absorptivity of the light is changed greatly. However, since the thickness of the optical absorption layer is small, if the wavelength of the light is different from the resonance wavelength, a change of the absorptivity of the light is small. Therefore, in order to operate the above-mentioned laser device effectively, it is necessary that the oscillation wavelength of the VCSEL strictly coincides with the resonance wavelength of the optical absorption layer. Thus, the production of the laser device is difficult.

In each of the laser devices of Japanese Laid-Open Patent Application No.2003-202529, Japanese Laid-Open Patent Application No.05-063301, and Appl. Phys. Lett. vol. 76, pp. 1975-1977 (2000), the laser light output intensity is modulated by changing the absorption loss or the refractive index of the resonator while the fixed current is introduced into the active layer. In this case, the carrier density inside the active layer is changed by a change of the optical output power inside the laser device. A certain time is needed for accumulating the carrier in the active layer, and this is the cause of a decrease of the modulation speed.

SUMMARY OF THE INVENTION

An object of the present invention is to provide an improved vertical cavity surface-emitting semiconductor laser device in which the above-described problems are eliminated.

Another object of the present invention is to provide a vertical cavity surface-emitting semiconductor laser device, an optical transmission module, an optical transmission device, and an optical switching method in which the change of the carrier density in the active layer is suppressed and the modulation is carried out at a higher speed than before.

In order to achieve the above-mentioned objects, the present invention provides a vertical cavity surface-emitting semiconductor laser device including a first semiconductor multilayer film reflector, a first resonator, a second semiconductor multilayer film reflector, a second resonator, and a third semiconductor multilayer film reflector which are provided on a substrate, the vertical cavity surface-emitting semiconductor laser device comprising: an active layer provided in one of the first resonator and the second resonator; an optical absorption layer provided in the other of the first resonator and the second resonator; a current introducing unit introducing a current to the active layer; and an electric field applying unit applying an electric field to the optical absorption layer, wherein first and second resonance wavelengths which are different are provided while the first resonator and the second resonator are coupled optically, and a gain of the active layer at the first resonance wavelength on the side of short wavelength is higher than that at the second resonance wavelength on the side of long wavelength, wherein an absorption coefficient of the optical absorption layer when no electric field is applied is small for the first and second resonance wavelengths, and when an electric field is applied, an absorption coefficient of the optical absorption layer for the first resonance wavelength on the side of short wavelength is larger than that for the second resonance wavelength on the side of long wavelength.

In order to achieve the above-mentioned objects, the present invention provides a vertical cavity surface-emitting semiconductor laser device including a first semiconductor multilayer film reflector, a first resonator, a second semiconductor multilayer film reflector, a second resonator, and a third semiconductor multilayer film reflector which are provided on a substrate, the vertical cavity surface-emitting semiconductor laser device comprising: an active layer provided in one of the first resonator and the second resonator; an optical absorption layer provided in the other of the first resonator and the second resonator; a current introducing unit introducing a current to the active layer; and an electric field applying unit applying an electric field to the optical absorption layer, wherein first and second resonance wavelengths which are different are provided while the first resonator and the second resonator are coupled optically, and a reflection loss at the first resonance wavelength on the side of short wavelength is smaller than that at the second resonance wavelength on the side of long wavelength, wherein an absorption coefficient of the optical absorption layer when no electric field is applied is small for the first and second resonance wavelengths, and when an electric field is applied, an absorption coefficient of the optical absorption layer for the first resonance wavelength on the side of short wavelength is larger than that for the second resonance wavelength on the side of long wavelength.

In order to achieve the above-mentioned objects, the present invention provides an optical transmission module including the above-mentioned vertical cavity surface-emitting semiconductor laser device, the optical transmission module comprising a wavelength selecting unit selecting one of the first and second resonance wavelengths for a laser light emitted by the vertical cavity surface-emitting semiconductor laser device.

In order to achieve the above-mentioned objects, the present invention provides an optical transmission device including the above-mentioned vertical cavity surface-emitting semiconductor laser device, the optical transmission module comprising: an optical fiber through which a laser light signal emitted by the vertical cavity surface-emitting semiconductor laser device is transmitted; a wavelength selecting unit selecting one of the first and second resonance wavelengths for the laser light signal emitted by the vertical cavity surface-emitting semiconductor laser device; and a photodetector receiving the selected one of the first and second resonance wavelengths of the laser light signal from the wavelength selecting unit.

In order to achieve the above-mentioned objects, the present invention provides an optical switching method for use in the above-mentioned vertical cavity surface-emitting semiconductor laser device, the optical switching method comprising the steps of: outputting a laser light with the first resonance wavelength while no electric field is applied to the optical absorption layer; outputting a laser light with the second resonance wavelength while the electric field is applied to the optical absorption layer; and switching one of the first resonance wavelength and the second resonance wavelength for the laser light output from the vertical cavity surface-emitting semiconductor laser device.

According to the vertical cavity surface-emitting semiconductor laser device, the optical transmission module, the optical transmission device, and the optical switching method of the present invention, it is possible to suppress the change of the carrier density in the active layer reliably and it is possible to carry out the wavelength modulation of the laser light of the VCSEL at a higher speed than in the conventional method.

BRIEF DESCRIPTION OF THE DRAWINGS

Other objects, features and advantages of the present invention will be apparent from the following detailed description when reading in conjunction with the accompanying drawings.

DETAILED DESCRIPTION OF PREFERRED EMBODIMENTS

A description will now be given of an embodiment of the invention with reference to the accompanying drawings.

Figure 1:
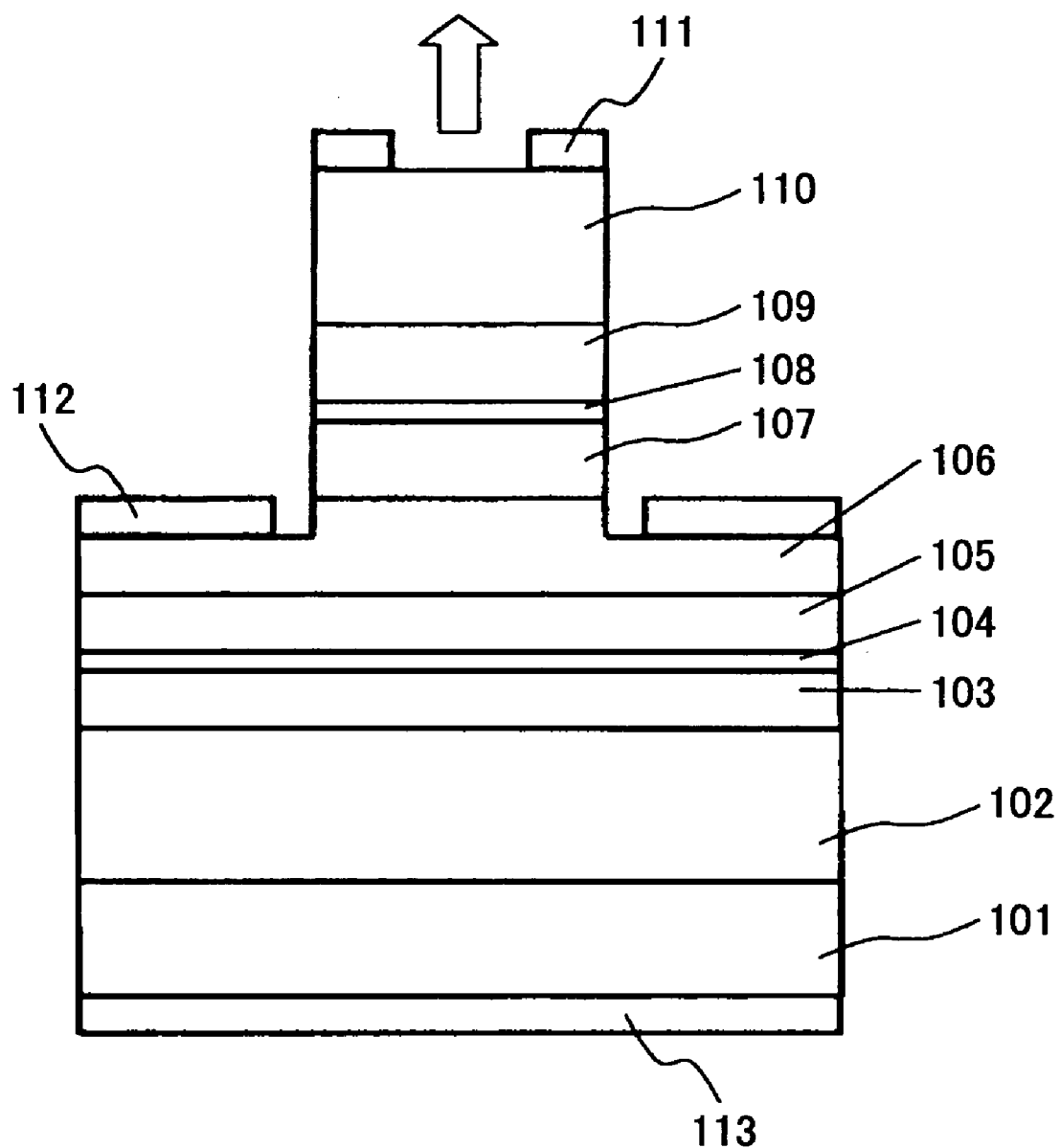
FIG. 1 is a diagram showing the composition of a vertical cavity surface-emitting laser device in an embodiment of the invention.

FIG. 1 shows the composition of a vertical cavity surface-emitting semiconductor laser device (VCSEL) in an embodiment of the invention.

Referring to FIG. 1, a lower distribution Bragg reflector (DBR) 102 of a 1st conductivity type, a 1st spacer layer 103, an active layer 104, a 2nd spacer layer 105, a DBR 106 of a 2nd conductivity type, a 3rd spacer layer 107, an optical absorption layer 108, a 4th spacer layer 109, and an upper DBR 110 of the 1st conductivity type are deposited sequentially on a semiconductor monocrystal substrate 101 of the 1st conductivity type.

The DBR is formed such that a high refractive index layer and a low refractive index layer are laminated alternately by ¼ of the optical length of an oscillation wavelength. The region between the lower DBR 102 of the 1st conductivity type and the DBR 106 of the 2nd conductivity type has a thickness equivalent to the optical length of one wavelength of the oscillation wavelength, and it constitutes a 1st resonator. The region between the DBR 106 of the 2nd conductivity type and the upper DBR 110 of the 1st conductivity type has a thickness equivalent to the optical length of one wavelength of the oscillation wavelength, and it constitutes a 2nd resonator.

The 1st resonator and the 2nd resonator have the equal resonator length. The lamination periodicity number of the DBR 106 of the 2nd conductivity type provided between them is made small (for example, 10 or less), the 1st resonator and the 2nd resonator are coupled optically, and two resonance wavelengths are provided.

Etching is performed from the surface of the above-mentioned lamination structure to the middle of the DBR 106 of the 2nd conductivity type, and the mesa structure is formed. The 1st electrode 111 is formed on the surface of the upper DBR 110 of the 1st conductivity type except for the light emission part. And the 2nd electrodes 112 are formed on the bottom of the mesa structure. The 3rd electrode 113 is formed on the back surface of the substrate 101.

By supplying the forward current between the 2nd electrode 112 and the 3rd electrode 113, the carrier is introduced into the active layer 104 and a light is emitted. The absorption edge of the optical absorption layer shifts to the long wavelength side according to the Franz-Keldish effect by supplying the reverse bias between the 1st electrode 111 and the 2nd electrode 112.

Specifically, the semiconductor monocrystal substrate 101 of the 1st conductivity type is constituted by a p type GaAs substrate, and the lower DBR 102 of the 1st conductivity type is formed such that a p type $Al_{0.2}Ga_{0.8}As$ layer and a p type AlAs layer are laminated alternately with the lamination periodicity number of 30.5. The 1st spacer layer 103 is made of $Al_{0.2}Ga_{0.8}As$, the active layer 104 is made of GaAs/$Al_{0.2}Ga_{0.8}As$ multiple quantum well structure, and the 2nd spacer layer 105 is made of $Al_{0.2}Ga_{0.8}As$.

The DBR 106 of the 2nd conductivity type is formed such that an n type $Al_{0.2}Ga_{0.8}As$ layer and an n type AlAs layer are laminated alternately with the lamination periodicity number of 8.5. The 3rd spacer layer 107 is made of $Al_{0.2}Ga_{0.8}As$, the optical absorption layer 108 is made of $Al_{0.08}Ga_{0.92}As$, and the 4th spacer layer 109 is made of $Al_{0.2}Ga_{0.8}As$. And the upper DBR 110 of the 1st conductivity type is formed such that a p type $Al_{0.2}Ga_{0.8}As$ layer and a p type AlAs layer are laminated alternately with the lamination periodicity number of 15.

Figure 10A:
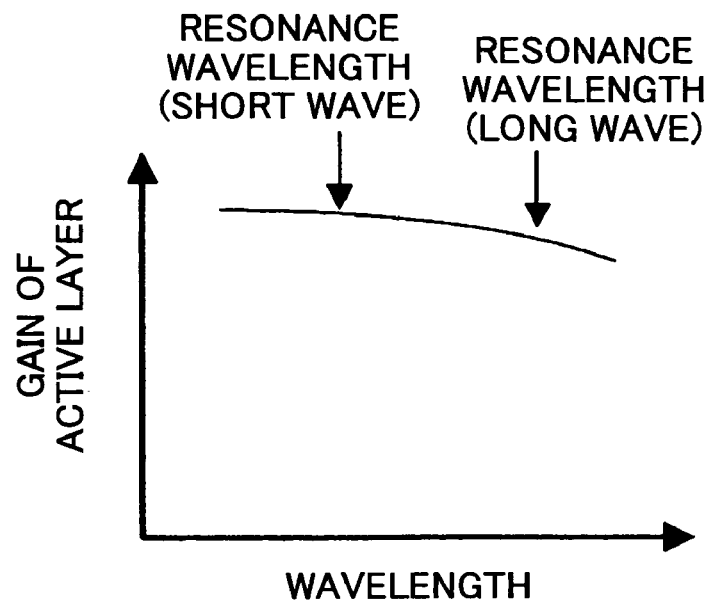
FIG. 10A and FIG. 10B are diagrams for explaining operation of the vertical cavity surface-emitting laser device of FIG. 1.

In the present embodiment, for example, the two resonance wavelengths wherein the 1st resonator and the 2nd resonator are coupled optically are set to 850 nm and 860 nm. The optical absorption layer 108 to which no electric field is applied is almost transparent to both the resonance wavelengths (850 nm) on the side of short wavelength and the resonance wavelength (860 nm) on the side of long wavelength. The gain peak wavelength of the active layer 104 is provided so that it is below the resonance wavelength (850 nm) on the side of short wavelength (refer to FIG. 10A).

Therefore, the gain of the active layer 104 at the resonance wavelength (850 nm) on the side of short wavelength is high than that at the resonance wavelength (860 nm) on the side of long wavelength. Usually, the VCSEL carries out the laser emission at the resonance wavelength (850 nm) on the side of short wavelength.

Figure 10B:
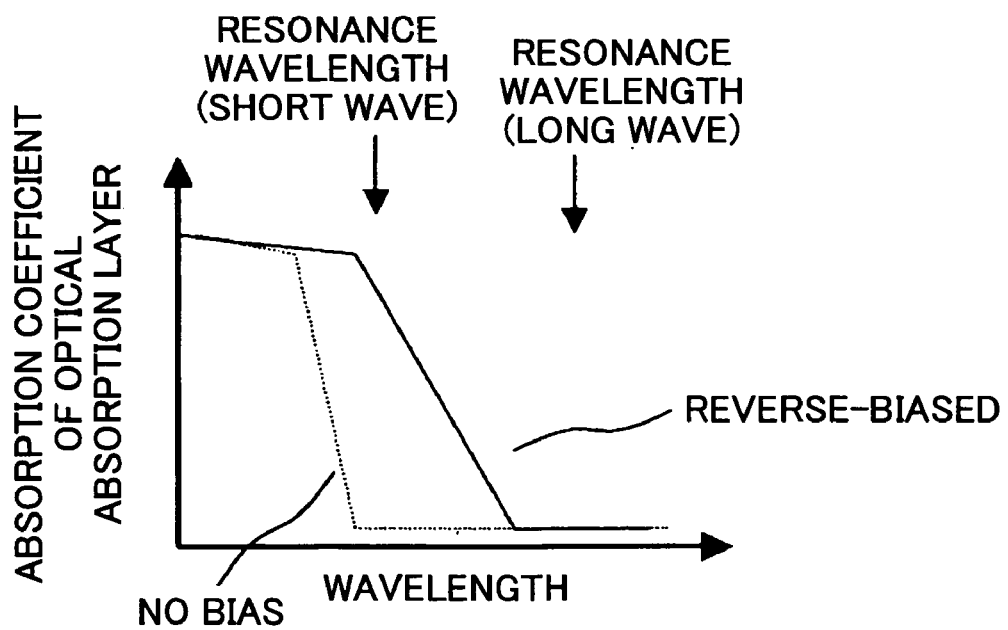

If the reverse bias is applied to the optical absorption layer 108, the absorption edge of the optical absorption layer 108 shifts to the long wavelength side, and the absorption coefficient is increased to the resonance wavelength (850 nm) on the side of short wavelength. On the other hand, the absorption coefficient at the resonance wavelength (860 nm) on the side of long wavelength is smaller than that at the resonance wavelength (850 nm) on the side of short wavelength, and the optical absorption layer 108 is almost transparent (refer to FIG. 10B).

Therefore, at the resonance wavelength (850 nm) on the side of short wavelength, the internal absorption loss of the VCSEL increases, and the oscillation wavelength of the VCSEL is shifted to the resonance wavelength (860 nm) on the side of long wavelength.

Accordingly, in the VCSEL of this embodiment, the current introduced into the active layer 104 is set a fixed value that is higher than the threshold current, and the bias applied to the optical absorption layer 108 is modulated, and it is possible to carry out the wavelength modulation (switching) of the oscillation wavelength of the VCSEL at high speed between the resonance wavelength (850 nm) on the side of short wavelength and the resonance wavelength (860 nm) on the side of long wavelength.

The changing rate of the absorption coefficient when applying the electric field to the optical absorption layer 108 is higher than the relaxation oscillation frequency of a semiconductor laser, and it is possible to carry out the modulation at high speed of over 40 GHz. In the present embodiment, not the laser light output intensity but the oscillation wavelength is modulated, the laser oscillation state is always maintained, and the carrier density change in the active layer can be suppressed. Therefore, the time to accumulate the carrier in the active layer is unnecessary, and the modulation can be carried out at a very high speed.

According to the present embodiment, it is possible to realize a VCSEL which is suitable for large capacity transmission whose data transmission capacity per channel exceeds 10 Gbps with a one-chip element (or by simple composition) without using an external modulator.

It is preferred to locate the absorption edge (which corresponds to an energy band gap) of the optical absorption layer 108 at a wavelength shorter than the resonance wavelength on the side of short wavelength when no electric field is applied, and to locate the same between the resonance wavelength on the side of short wavelength and the resonance wavelength on the side of long wavelength when an electric field is applied. In this case, a change of the optical absorption coefficient by electric field application can be enlarged.

It is preferred that the difference between the energy corresponding to the resonance wavelength on the side of short wavelength and the absorption edge of the optical absorption layer 108 is 30 meV or less, although the absorption edge of the optical absorption layer 108 when no electric field is applied is located at a wavelength shorter than the resonance wavelength on the side of short wavelength. Thereby, the voltage applied to the optical absorption layer 108 can be made to be lower than 3V.

In a conventional electro absorption optical modulator, the light intensity is attenuated by absorbing the light continuously emitted by the laser oscillation, in the optical absorption layer. Therefore, in order to make the S/N ratio of light intensity modulation large, the optical absorption coefficient of the optical absorption layer must be enlarged, and the optical absorption region must be lengthened.

In contrast, according to the invention, the VCSEL operates by performing the optical absorption such that the laser oscillation is performed while priority is given to the resonance wavelength on the side of long wavelength over the resonance wavelength on the side of short wavelength. Therefore, a change of the optical absorption coefficient can be made smaller than before, and it is possible to carry out the modulation operation at a low voltage.

Also, in the laser device of Japanese Laid-Open Patent Application No.05-063301, the refractive index of one of the pair of distribution Bragg reflectors (DBR) of the VCSEL is changed by electric field or carrier introducing, or optical introducing, and the resonance wavelength of the DBR is changed. However, the amount of change of the above-mentioned refractive index is very small, and the amount of the wavelength shift which can be realized is on the order of several nanometers or less.

In contrast, according to the present embodiment of the invention, the wavelength switching is performed between the two resonance wavelengths wherein the two resonators are coupled optically, and the amount of change of the wavelength can be enlarged to a range of 10-20 nm. Therefore, the wavelength modulation can be performed with a sufficiently large change when compared with a change of the VCSEL oscillation wavelength due to an environmental temperature change, and it is not necessary to carry out temperature control of the VCSEL by using a Peltier device etc.

In this embodiment, the active layer 104 is provided in the 1st resonator on the side of the substrate and the optical absorption layer 108 is provided in the 2nd resonator on the side of the light outgoing surface. The present invention is not limited to this embodiment. Alternatively, the active layer 104 may be provided in the 2nd resonator and the optical absorption layer 108 may be provided in the 1st resonator.

In the vertical cavity surface emitting semiconductor laser device (VCSEL) of this embodiment, a 1st semiconductor multilayer film reflector, a 1st resonator, a 2nd semiconductor multilayer film reflector, a 2nd resonator, and a 3rd semiconductor multilayer film reflector are provided on a substrate. An active layer is provided in one of the 1st resonator and the 2nd resonator, and an optical absorption layer is provided in the other of the 1st resonator and the 2nd resonator. A current introducting unit which introduces a current to the active layer, and an electric field applying unit which applies an electric field to the optical absorption layer are provided.

In the above-mentioned vertical cavity surface-emitting semiconductor laser device (VCSEL), first and second resonance wavelengths which are different are provided while the 1st resonator and 2nd resonator are coupled optically, and a gain of the active layer at the first resonance wavelength on the side of short wavelength is higher than that at the second resonance wavelength on the side of long wavelength. An absorption coefficient of the optical absorption layer when no electric field is applied is small for the first and second resonance wavelengths, and when an electric field is applied, an absorption coefficient of the optical absorption layer for the first resonance wavelength on the side of short wavelength is larger than that for the second resonance wavelength on the side of long wavelength.

In the present embodiment, when no electric field is applied to the optical absorption layer, the VCSEL carries out the laser emission at the first resonance wavelength on the side of short wavelength, and when the electric field (reverse bias) is applied to the optical absorption layer, the absorption coefficient becomes large to the first resonance wavelength on the side of short wavelength. The oscillation wavelength of the VCSEL shifts to the second resonance wavelength on the side of long wavelength. Therefore, it is possible to carry out the wavelength modulation of the laser light of the VCSEL by modulating the electric field (bias) applied to the optical absorption layer.

The rate of the absorption coefficient change when applying the electric field to the optical absorption layer can be made higher than the relaxation oscillation frequency of a semiconductor laser. In the wavelength modulation, the laser oscillation state is always maintained and the carrier density change in the active layer can be suppressed. Thus, the modulation can be carried out at much more high speed. Thereby, a light source which is suitable for large capacity transmission applications whose transmission capacity per channel exceeds 10 Gbps can be realized by a simple composition without using an external modulator.

Figure 2:
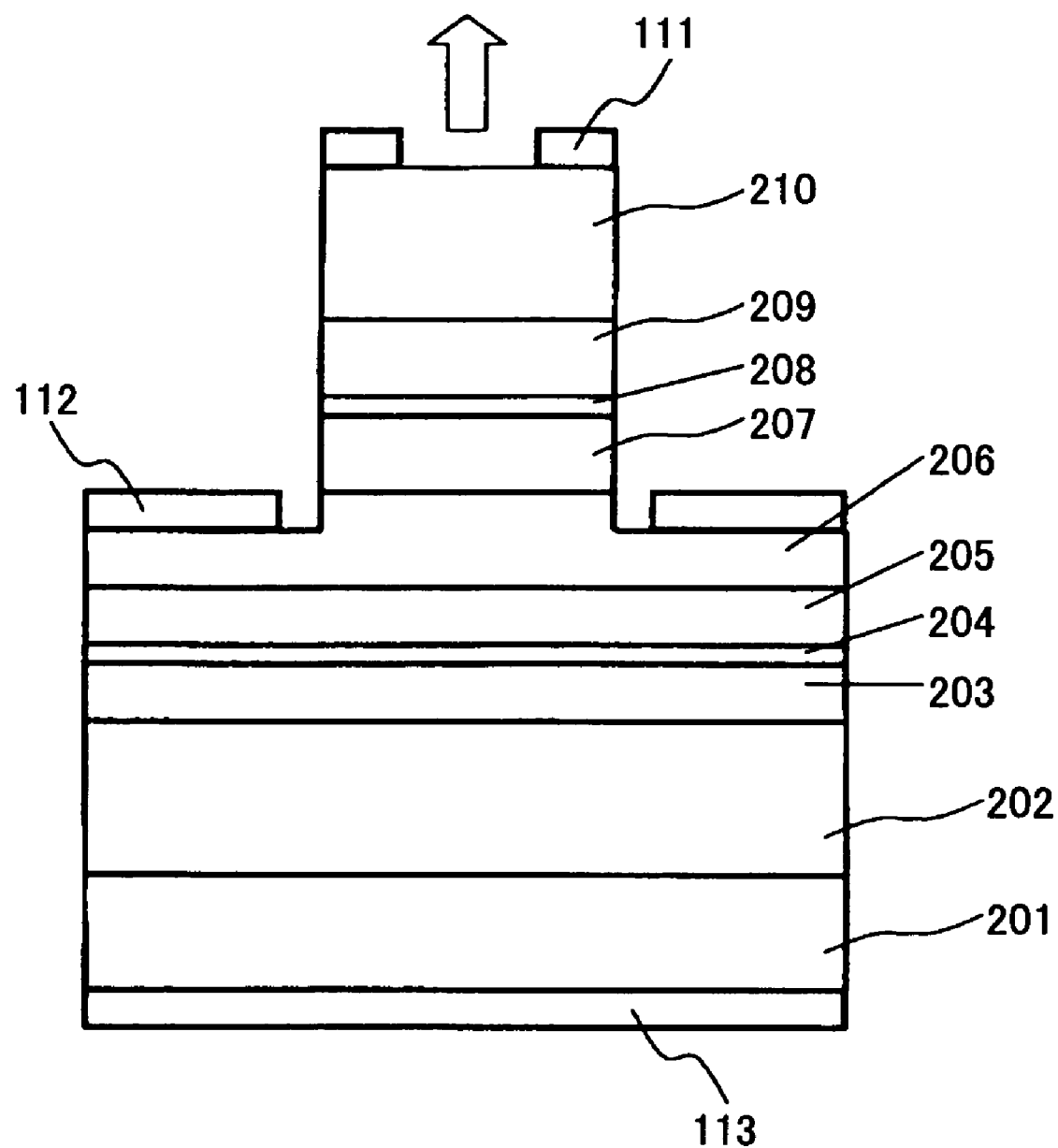
FIG. 2 is a diagram showing the composition of a vertical cavity surface-emitting. laser device in another embodiment of the invention.

Next, a description is given of another embodiment of the invention. FIG. 2 shows the composition of a vertical cavity surface-emitting semiconductor laser device (VCSEL) in this embodiment.

Referring to FIG. 2, a lower DBR 202 of a 1st conductivity type, a 1st spacer layer 203, an active layer 204, a 2nd spacer layer 205, a DBR 206 of a 2nd conductivity type, a 3rd spacer layer 207, an optical absorption layer 208, a 4th spacer layer 209, and an upper DBR 210 of the 1st conductivity type are deposited sequentially on a semiconductor monocrystal substrate 201 of the 1st conductivity type.

The lamination structure of this embodiment is essentially the same as that of the previous embodiment.

Specifically, the semiconductor monocrystal substrate 201 of the 1st conductivity type is constituted by a p type GaAs substrate, and the lower DBR 202 of the 1st conductivity type is formed such that a p type GaAs layer and a p type AlAs layer are laminated alternately with the lamination periodicity number of 30.5. The 1st spacer layer 203 is made of $Al_{0.2}Ga_{0.8}As$, the active layer 204 is made of GaInAs/$Al_{0.2}Ga_{0.8}As$ multiple quantum well structure, and the 2nd spacer layer 205 is made of $Al_{0.2}Ga_{0.8}As$.

The DBR 206 of the 2nd conductivity type is formed such that an n type GaAs layer and an n type AlAs layer are laminated alternately with the lamination periodicity number of 8.5. The 3rd spacer layer 207 is made of $Al_{0.2}Ga_{0.8}As$, the optical absorption layer 208 is made of GaAs, and the 4th spacer layer 209 is made of $Al_{0.2}Ga_{0.8}As$. And the upper DBR 210 of the 1st conductivity type is formed such that a p type GaAs layer and a p type AlAs layer are laminated alternately with the lamination periodicity number of 15.

In the present embodiment, for example, the two resonance wavelengths wherein the 1st resonator and the 2nd resonator are coupled optically are set to 900 nm and 910 nm. The gain of the active layer 204 is almost the same for both the resonance wavelength (900 nm) on the side of short wavelength and the resonance wavelength (910 nm) on the side of long wavelength.

When no electric field is applied, the absorption edge of the optical absorption layer 208 is located at a wavelength shorter than the resonance wavelength (900 nm) on the side of short wavelength, and the optical absorption layer 208 is transparent to both the resonance wavelength (900 nm) on the side of short wavelength and the resonance wavelength (910 nm) on the side of long wavelength. The reflection center wavelength of the upper DBR 210 of the 1st conductivity type is shorter than the resonance wavelength (900 nm) on the side of short wavelength.

Figure 11A:
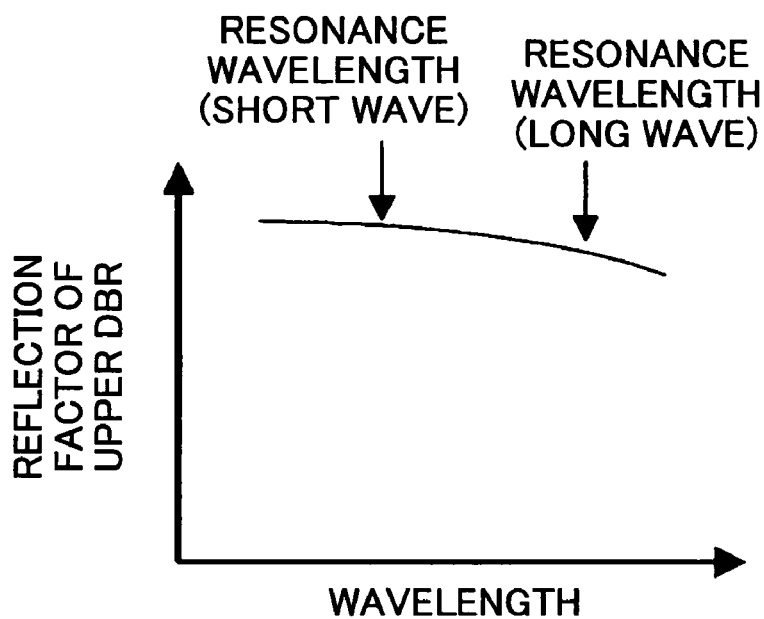
FIG. 11A and FIG. 11B are diagrams for explaining operation of the vertical cavity surface-emitting laser device of FIG. 2.

Therefore, the reflectivity of the upper DBR 210 of the 1st conductivity type at the resonance wavelength (900 nm) on the side of short wavelength is higher than that at the resonance wavelength (910 nm) on the side of long wavelength (refer to FIG. 11A). For this reason, the reflection loss at the resonance wavelength (900 nm) on the side of short wavelength is lower than that at the resonance wavelength (910 nm) on the side of long wavelength, and the VCSEL usually carries out the laser emission at the resonance wavelength (900 nm) on the side of short wavelength.

Figure 11B:
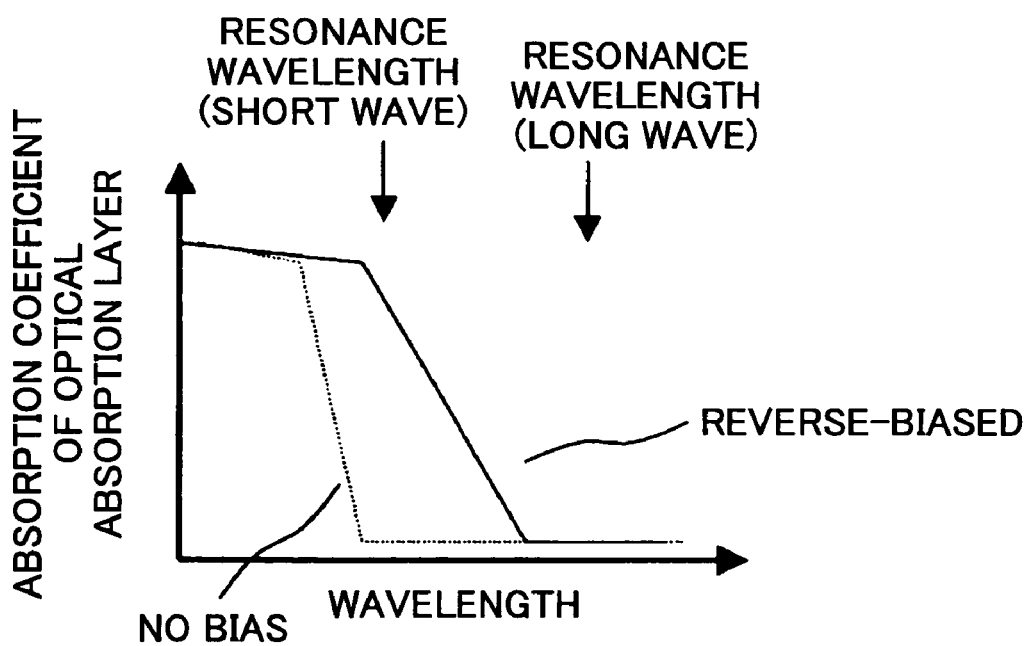

On the other hand, when the reverse bias is applied to the optical absorption layer 208, the absorption edge of the optical absorption layer 208 shifts to the long wavelength side, and the absorption coefficient is increased at the resonance wavelength (900 nm) on the side of short wavelength, and the optical absorption layer 208 is almost transparent at the resonance wavelength (910 nm) on the side of long wavelength (refer to FIG. 11B). Therefore, at the resonance wavelength (900 nm) on the side of short wavelength, the internal absorption loss of the VCSEL is increased, and the oscillation wavelength of the VCSEL is shifted to the resonance wavelength (910 nm) on the side of long wavelength.

Accordingly, in the VCSEL of this embodiment, the current introduced into the active layer 204 is set to a fixed value that is higher than the threshold current, and the bias applied to the optical absorption layer 208 is modulated, and it is possible to carry out the wavelength modulation (switching) of the oscillation wavelength of the VCSEL at high speed between the resonance wavelength (900 nm) on the side of short wavelength and the resonance wavelength (910 nm) on the side of long wavelength.

In this embodiment, the reflection center wavelength of the upper DBR 210 of the 1st conductivity type is set to a wavelength that is shorter than the resonance wavelength (900 nm) on the side of short wavelength. The present invention is not limited to this embodiment. Alternatively, the reflection center wavelength of either the lower DBR 202 of the 1st conductivity type or the DBR 206 of the 2nd conductivity type may be set to a wavelength that is shorter than the resonance wavelength on the side of short wavelength, thereby constituting the VCSEL so that the reflection loss at the resonance wavelength on the side of short wavelength is lower than that at the resonance wavelength on the side of long wavelength similarly.

In order to make the gain of the active layer 204 at the resonance wavelength on the side of short wavelength and the gain of the active layer 204 at the resonance wavelength on the side of long wavelength become almost the same, the active layer 204 may be formed from the multiple quantum well structure in which two or more quantum well layers having different gain peak wavelengths are laminated.

In the vertical cavity surface emitting semiconductor laser device (VCSEL) of this embodiment, a 1st semiconductor multilayer film reflector, a 1st resonator, a 2nd semiconductor multilayer film reflector, a 2nd resonator, and a 3rd semiconductor multilayer film reflector are provided on a substrate. An active layer is provided in one of the 1st resonator and the 2nd resonator, an optical absorption layer is provided in the other of the 1st resonator and the 2nd resonator. A current introducting unit which introduces a current to the active layer, and an electric field applying unit which applies an electric field to the optical absorption layer are provided.

In the above-mentioned vertical cavity surface-emitting semiconductor laser device, first and second resonance wavelengths which are different are provided while the 1st resonator and 2nd resonator have coupled optically, and a reflection loss at the first resonance wavelength on the side of short wavelength is smaller than that at the second resonance wavelength on the side of long wavelength. An absorption coefficient of the optical absorption layer when no electric field is applied is small for the first and second resonance wavelengths, and when an electric field is applied, an absorption coefficient of the optical absorption layer for the first resonance wavelength on the side of short wavelength is larger than that for the second resonance wavelength on the side of long wavelength.

In the present embodiment, when no electric field is applied to the optical absorption layer, the VCSEL carries out the laser emission at the first resonance wavelength on the side of short wavelength, and when an electric field (reverse bias) is applied to the optical absorption layer, the absorption coefficient becomes large to the first resonance wavelength on the side of short wavelength. The oscillation wavelength of the VCSEL shifts to the second resonance wavelength on the side of long wavelength. Therefore, it is possible to carry out the wavelength modulation of the laser light of the VCSEL by modulating the electric field (bias) applied to the optical absorption layer.

The rate of the absorption coefficient change when applying the electric field to the optical absorption layer can be made higher than the relaxation oscillation frequency of a semiconductor laser. In the wavelength modulation, the laser oscillation state is always maintained and the carrier density change in the active layer can be suppressed. Thus, the modulation can be carried out at a very high speed. Thereby, a light source which is suitable for large capacity transmission applications whose transmission capacity per channel exceeds 10 Gbps can be realized by a simple composition without using an external modulator.

Figure 3:
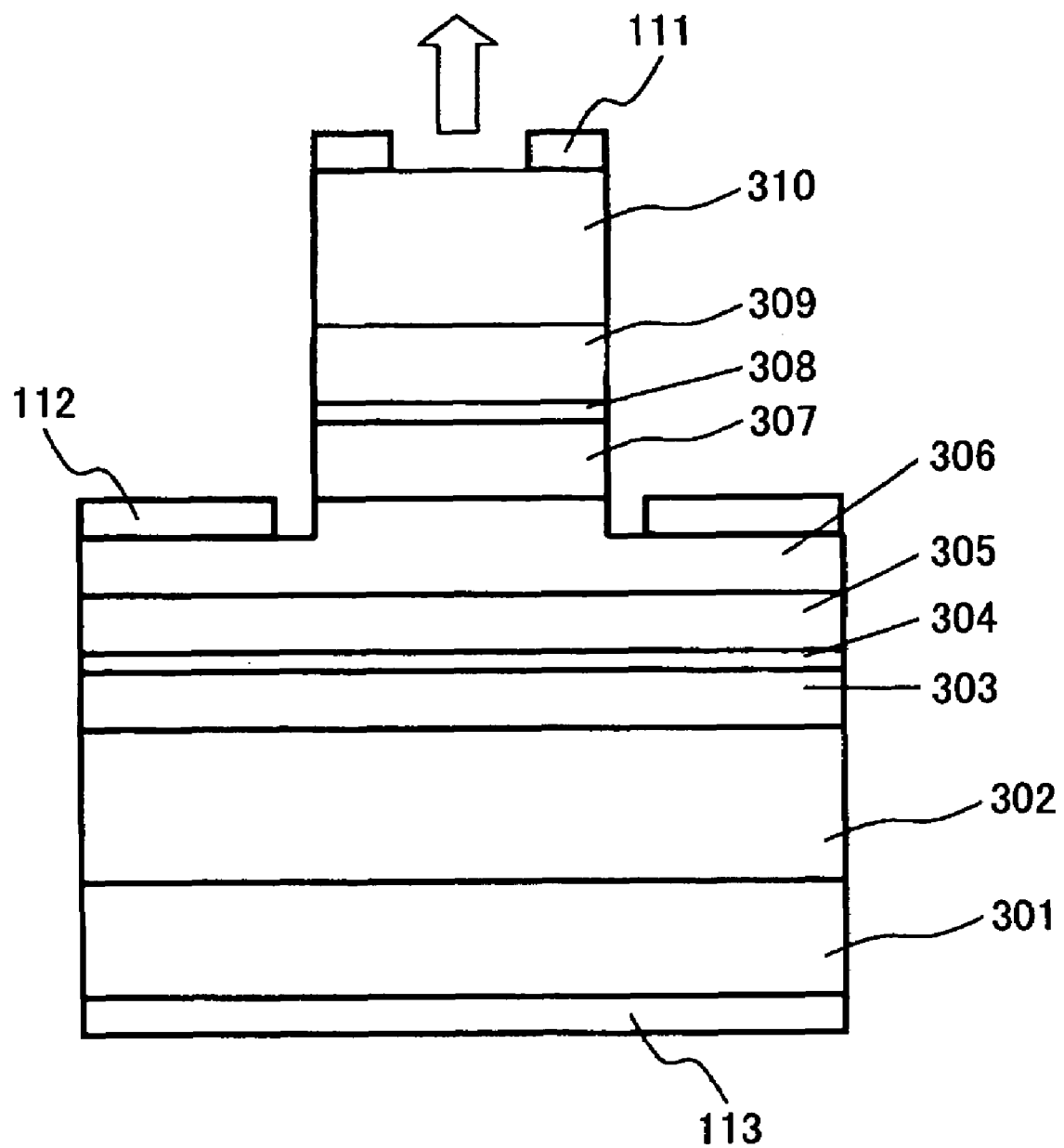
FIG. 3 is a diagram showing the composition of a vertical cavity surface-emitting laser device in another embodiment of the invention.

Next, a description is given of another embodiment of the invention. FIG. 3 shows the composition of a vertical cavity surface-emitting semiconductor laser device (VCSEL) in this embodiment.

Referring to FIG. 3, a lower DBR 302 of a 1st conductivity type, a 1st spacer layer 303, an active layer 304, a 2nd spacer layer 305, a DBR 306 of a 2nd conductivity type, a 3rd spacer layer 307, a quantum well optical absorption layer 308, a 4th spacer layer 309, and an upper DBR 310 of the 1st conductivity type are deposited sequentially on a semiconductor monocrystal substrate 301 of the 1st conductivity type.

The lamination structure of this embodiment is essentially the same as that of the previous embodiment.

Specifically, the semiconductor monocrystal substrate 301 of the 1st conductivity type is constituted by a p type GaAs substrate, and the lower DBR 302 of the 1st conductivity type is formed such that a p type GaAs layer and a p type AlAs layer are laminated alternately with the lamination periodicity number of 30.5. The 1st spacer layer 303 is made of $Al_{0.2}Ga_{0.8}As$, the active layer 304 is made of $GaInAs/Al_{0.2}Ga_{0.8}As$ multiple quantum well structure, and the 2nd spacer layer 305 is made of $Al_{0.2}Ga_{0.8}As$.

The DBR 306 of the 2nd conductivity type is formed such that an n type GaAs layer and 8.5 cycles of an n type AlAs layer are laminated alternately with the lamination periodicity number of 8.5. The 3rd spacer layer 307 is made of $Al_{0.2}Ga_{0.8}As$, the quantum well optical absorption layer 308 is made of $GaInAs/Al_{0.2}Ga_{0.8}As$ multiple quantum well structure, and the 4th spacer layer 309 is made of $Al_{0.2}Ga_{0.8}As$. And the upper DBR 310 of the 1st conductivity type is formed such that a p type GaAs layer and a p type AlAs layer are laminated alternately with the lamination periodicity number of 15.

In the present embodiment, for example, the two resonance wavelengths wherein the 1st resonator and the 2nd resonator are coupled optically are set to 970 nm and 990 nm.

When no electric field is applied, the absorption edge of the optical absorption layer 308 is located at a wavelength shorter than the resonance wavelength (970 nm) on the side of short wavelength, and the optical absorption layer 308 is transparent to both the resonance wavelengths (970 nm) on the side of short wavelength and the resonance wavelength (990 nm) on the side of long wavelength. The VCSEL is constituted so that the gain peak wavelength of the active layer 304 is less than the resonance wavelength (970 nm) on the side of short wavelength. Therefore, the gain of the active layer 304 at the resonance wavelength (970 nm) on the side of short wavelength is higher than that at the resonance wavelength (990 nm) on the side of long wavelength, and the VCSEL usually carries out the laser emission at the resonance wavelength (970 nm) on the side of short wavelength.

On the other hand, when the reverse bias is applied to the optical absorption layer 308, the absorption edge of the optical absorption layer 308 shifts to a wavelength between the resonance wavelength (970 nm) on the side of short wavelength and the resonance wavelength (990 nm) on the side of long wavelength according to the quantum confined Stark effect. Thereby, the absorption coefficient for the resonance wavelength (970 nm) on the side of short wavelength becomes large, and the optical absorption layer becomes transparent for the resonance wavelength (990 nm) on the side of long wavelength.

Therefore, at the resonance wavelength (970 nm) on the side of short wavelength, the internal absorption loss of the VCSEL is increased, and the oscillation wavelength of the VCSEL is shifted to the resonance wavelength (990 nm) on the side of long wavelength.

Accordingly, in the VCSEL of this embodiment, the current introduced into the active layer 304 is set to a fixed value that is higher than the threshold current, and the bias applied to the optical absorption layer 308 is modulated, and it is possible to carry out the wavelength modulation (switching) of the oscillation wavelength of the VCSEL at high speed between the resonance wavelength (970 nm) on the side of short wavelength and the resonance wavelength (990 nm) on the side of long wavelength.

In this embodiment, the optical absorption layer 308 is made of $GaInAs/Al_{0.2}Ga_{0.8}As$ multiple quantum well structure. With the optical absorption layer 308 made of $GaInAs/Al_{0.2}Ga_{0.8}As$ multiple quantum well structure being used, a steep optical absorption edge (when compared with a bulk optical absorption layer) can be obtained even if the reverse bias is applied, because the excitons are enclosed in the GaInAs quantum well layer.

Figure 12:
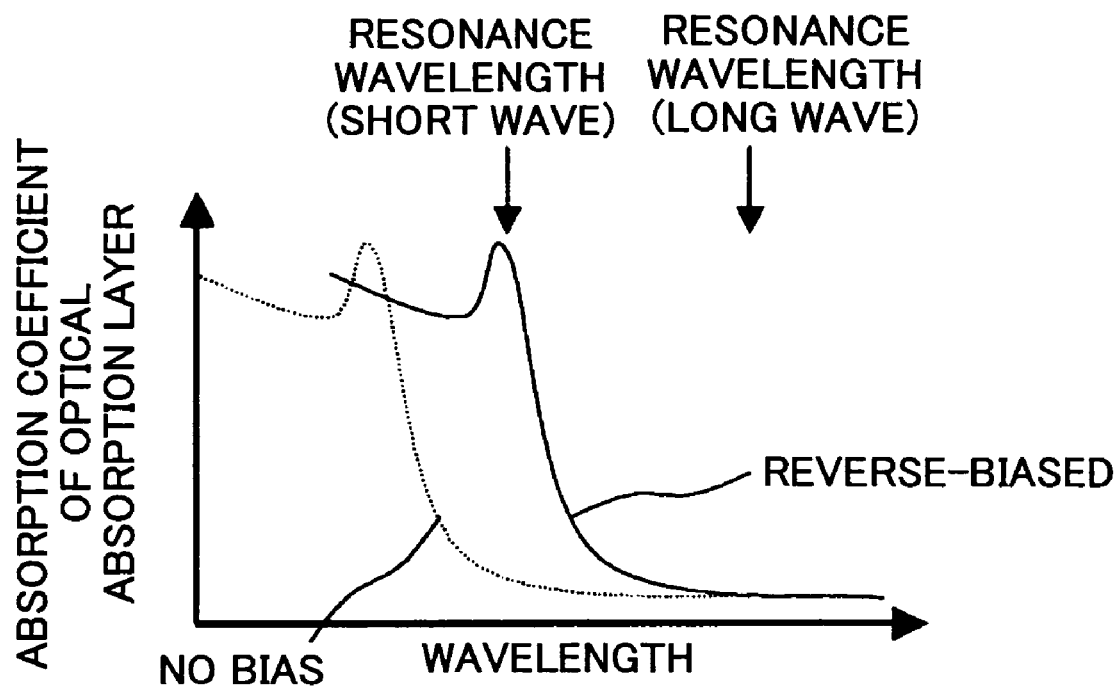
FIG. 12 is a diagram for explaining operation of the optical absorption layer in the vertical cavity surface-emitting laser device of FIG. 3.

Therefore, when the reverse bias is applied to the optical absorption layer 308, it is possible to provide a large difference in the absorption coefficient between the resonance wavelength (970 nm) on the side of short wavelength and the resonance wavelength (990 nm) on the side of long wavelength (refer to FIG. 12).

In this embodiment, the $GaInAs/Al_{0.2}Ga_{0.8}As$ multiple quantum well structure which includes strain in the well layer is used as the optical absorption layer. The present invention is not limited to this embodiment. Alternatively, a multiple quantum well structure which does not include strain, a distorted compensation structure where a well layer and a barrier layer have strains in the opposing directions, and a single quantum well structure may be used instead.

Figure 4:
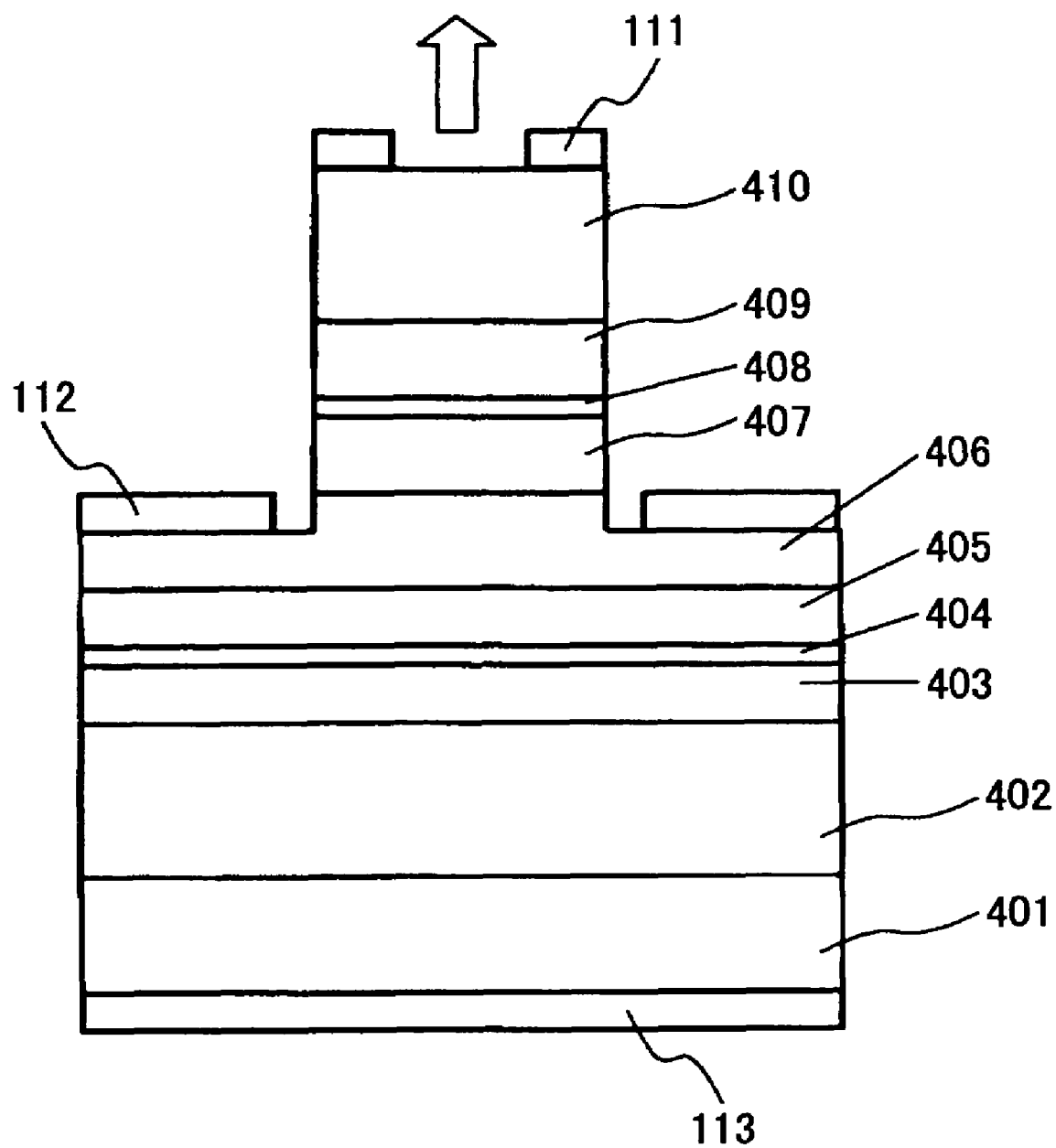
FIG. 4 is a diagram showing the composition of a vertical cavity surface-emitting laser device in another embodiment of the invention.

Next, a description is given of another embodiment of the invention. FIG. 4 shows the composition of a vertical cavity surface-emitting semiconductor laser device (VCSEL) in this embodiment.

Referring to FIG. 4, an n type lower DBR 402, a 1st spacer layer 403, an active layer 404, a 2nd spacer layer 405, a p type DBR 406, a 3rd spacer layer 407, an optical absorption layer 408, a 4th spacer layer 409, and an n type upper DBR 410 are deposited sequentially on an n type semiconductor monocrystal substrate 401.

Specifically, the n type semiconductor monocrystal substrate 401 is constituted by an n type GaAs substrate, and the n type lower DBR 402 is formed such that an n type GaAs and an n type AlAs layer are laminated alternately with the lamination periodicity number of 30.5. The 1st spacer layer 403 is made of $Al_{0.2}Ga_{0.8}As$, the active layer 404 is made of $GaInAs/Al_{0.2}Ga_{0.8}As$ multiple quantum well structure, and the 2nd spacer layer 405 is made of $Al_{0.2}Ga_{0.8}As$.

The p type DBR 406 is formed such that a p type GaAs layer and a p type AlAs layer are laminated alternately with the lamination periodicity number of 8.5. The 3rd spacer layer 407 is made of $Al_{0.2}Ga_{0.8}As$, the optical absorption layer 408 is made of $GaInAs/Al_{0.2}Ga_{0.8}As$ multiple quantum well structure, and the 4th spacer layer 409 is made of $Al_{0.2}Ga_{0.8}As$. And the n type upper DBR 410 is formed such that an n type GaAs and an n type AlAs layer are laminated alternately with the lamination periodicity number of 15.

The VCSEL of this embodiment is characterized in that the n type substrate is used and the "npn" structure is constituted. Except for this point, the composition and operation of this embodiment is essentially the same as those of the previous embodiment of FIG. 3.

Since it is necessary to make the lower DBR 402 and the upper DBR 410 into a high reflectivity in order to reduce the threshold current of the VCSEL, the lamination periodicity number of a high refractive index layer and a low refractive index layer which constitutes the DBR is increased.

On the other hand, since the two resonators must be coupled optically, the lamination periodicity number of the DBR 406 provided between the 1st resonator and the 2nd resonator has to be reduced to 10 or less.

Lamination of semiconductor layers having different refractive indexes will form a hetero barrier in the interface. In a semiconductor layer, the effective mass of a hole is much larger than the effective mass of an electron, it is difficult for a hole to pass through the hetero barrier. Therefore, a resistance of a DBR in which the p type semiconductor layers are laminated is higher than a resistance of a DBR in which the n-type semiconductor layers are laminated.

Accordingly, since a high reflectivity is required for this embodiment, the resistance of the elements is reduced by forming the lower DBR 402 and the upper DBR 410 adjacent to the substrate with the number of n type materials being increased. Thereby, the power consumption of the VCSEL can be reduced.

Figure 5:
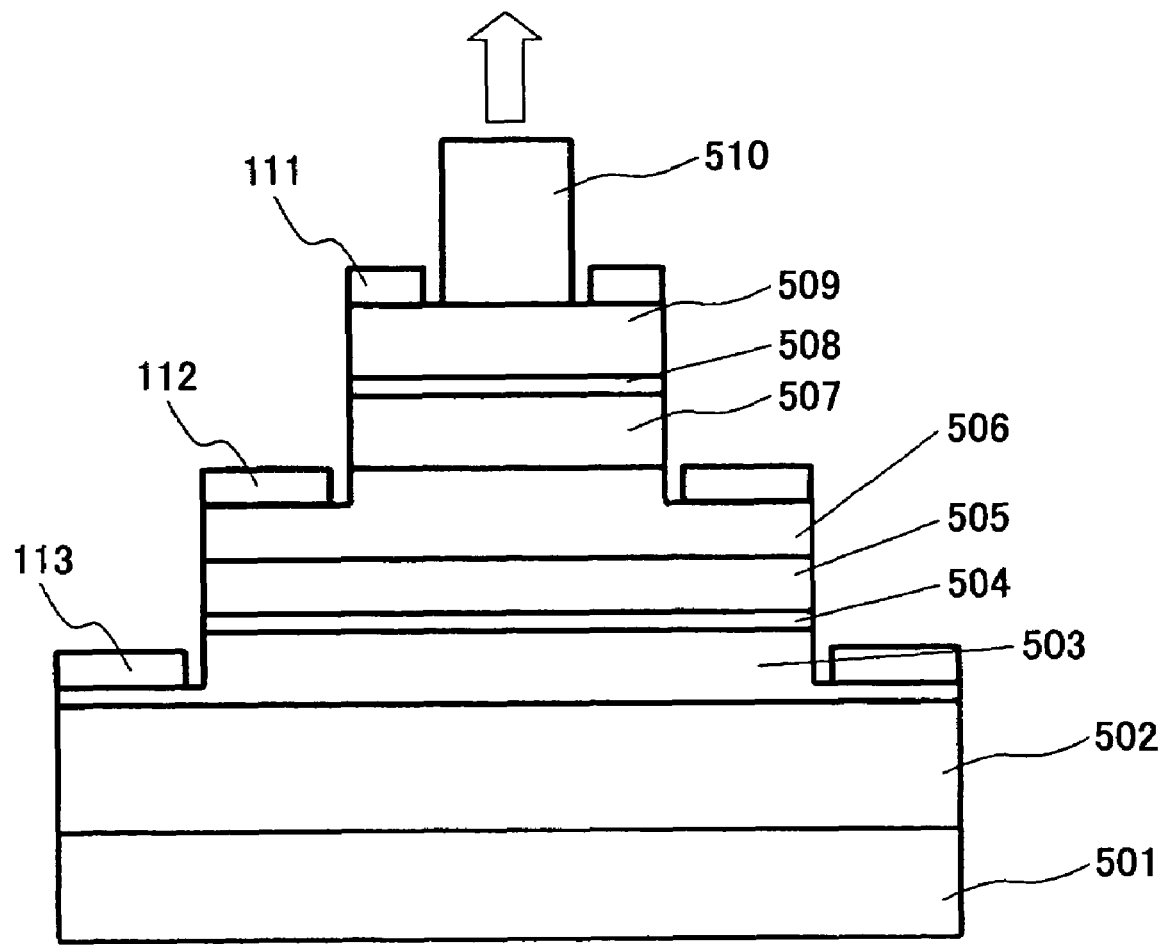
FIG. 5 is a diagram showing the composition of a vertical cavity surface-emitting laser device in another embodiment of the invention.

Next, a description is given of another embodiment of the invention. FIG. 5 shows the composition of a vertical cavity surface-emitting semiconductor laser device (VCSEL) in this embodiment.

Referring to FIG. 5, a lower DBR 502 of a low carrier concentration, a 1st spacer layer 503, an active layer 504, a 2nd spacer layer 505, a p type or n type DBR 506, a 3rd spacer layer 507, an optical absorption layer 508, a 4th spacer layer 509, and an upper DBR 510 of a low carrier concentration are deposited sequentially on a monocrystal substrate 501.

Etching is performed from the surface of the above lamination structure to the surface of the 4th spacer layer 509, and the 1st mesa structure is formed. Etching is performed to the middle of the p type or n type DBR 506, and the 2nd mesa structure which is larger in size than the 1st mesa structure is formed. Moreover, etching is performed to the 1st spacer layer 503, and the 3rd mesa structure which is larger in size than the 2nd mesa structure is formed.

And the 1st electrode 111 is formed on the 1st mesa structure bottom (the 2nd mesa structure top surface). The 2nd electrode 112 is formed on the 2nd mesa structure bottom (the 3rd mesa structure top surface). The 3rd electrode 113 is formed on the 3rd mesa structure bottom.

By supplying the forward current between the 2nd electrode 112 and the 3rd electrode 113, the carrier is introduced into the active layer 504 and a light is emitted. The absorption edge of the optical absorption layer 508 shifts to the long wavelength side by supplying the reverse bias between the 1st electrode 111 and the 2nd electrode 112.

Specifically, the monocrystal substrate 501 is constituted by a semi-insulation GaAs substrate, and the lower DBR 502 is formed such that a low carrier concentration GaAs and a low carrier concentration AlAs are laminated alternately with the lamination periodicity number of 30.5. The 1st spacer layer 503 is made of p type $Al_{0.2}Ga_{0.8}As$, the active layer 504 is made of $GaInAs/Al_{0.2}Ga_{0.8}As$ multiple quantum well structure, and the 2nd spacer layer 505 is made of $Al_{0.2}Ga_{0.8}As$.

The DBR 506 is formed such that an n type GaAs and an n type AlAs are laminated alternately with the lamination periodicity number of 8.5. The 3rd spacer layer 507 is made of $Al_{0.2}Ga_{0.8}AS$, the optical absorption layer 508 is made of $GaInAs/Al_{0.2}Ga_{0.8}As$ multiple quantum well structure, and the 4th spacer layer 509 is made of n type $Al_{0.2}Ga_{0.8}As$. And the upper DBR 510 is formed such that a low carrier concentration GaAs and a low carrier concentration AlAs are laminated alternately with the lamination periodicity number of 15.

The VCSEL of this embodiment is characterized in that the upper part DBR and the lower part DBR are of the low carrier concentration layer, and a current does not pass along the inside of the upper part DBR and the lower DBR layer. The 1st electrode 111 is formed on the n type 4th spacer layer 509 and the 3rd electrode 113 is formed in the n type 1st spacer layer 503. Except for these points, the composition and operation of this embodiment are essentially the same as those of the previous embodiment of FIG. 3.

An increase of the carrier concentration of the semiconductor layer which constitutes a DBR will increase the optical absorption by a free carrier. Furthermore, an increase of hole concentration in a p type semiconductor layer will increase the absorption between valence bands and the optical absorption by the Auger recombination, in addition to the free carrier absorption.

In order to reduce the threshold current of the VCSEL, it is necessary that the lower DBR 502 adjacent to the substrate and the upper DBR 510 on the side of the top surface have a high reflectivity. For this reason, the lamination periodicity number of these DBRs is increased. With the lower DBR 502 and the upper DBR 510 having an increased lamination periodicity number, the internal absorption loss of the VCSEL can be effectively reduced by reducing the carrier concentration of each semiconductor layer. Therefore, the threshold current of VCSEL can be reduced further and the external quantum efficiency can also be increases.

In order to reduce the free carrier absorption in a semiconductor layer to 10 (1/cm) or less and prevent the influence of optical absorption loss, it is preferred that the carrier concentration of a low carrier concentration layer is below 1E+18 $(1/cm^3)$.

A low carrier concentration layer can be formed by the crystal growth without supplying dopant at the time of the crystal growth of the semiconductor layer. Or it may be formed by controlling and compensating the donor and acceptor concentration and reducing the carrier concentration, or by add the impurities which inactivate the carrier.

Figure 6:
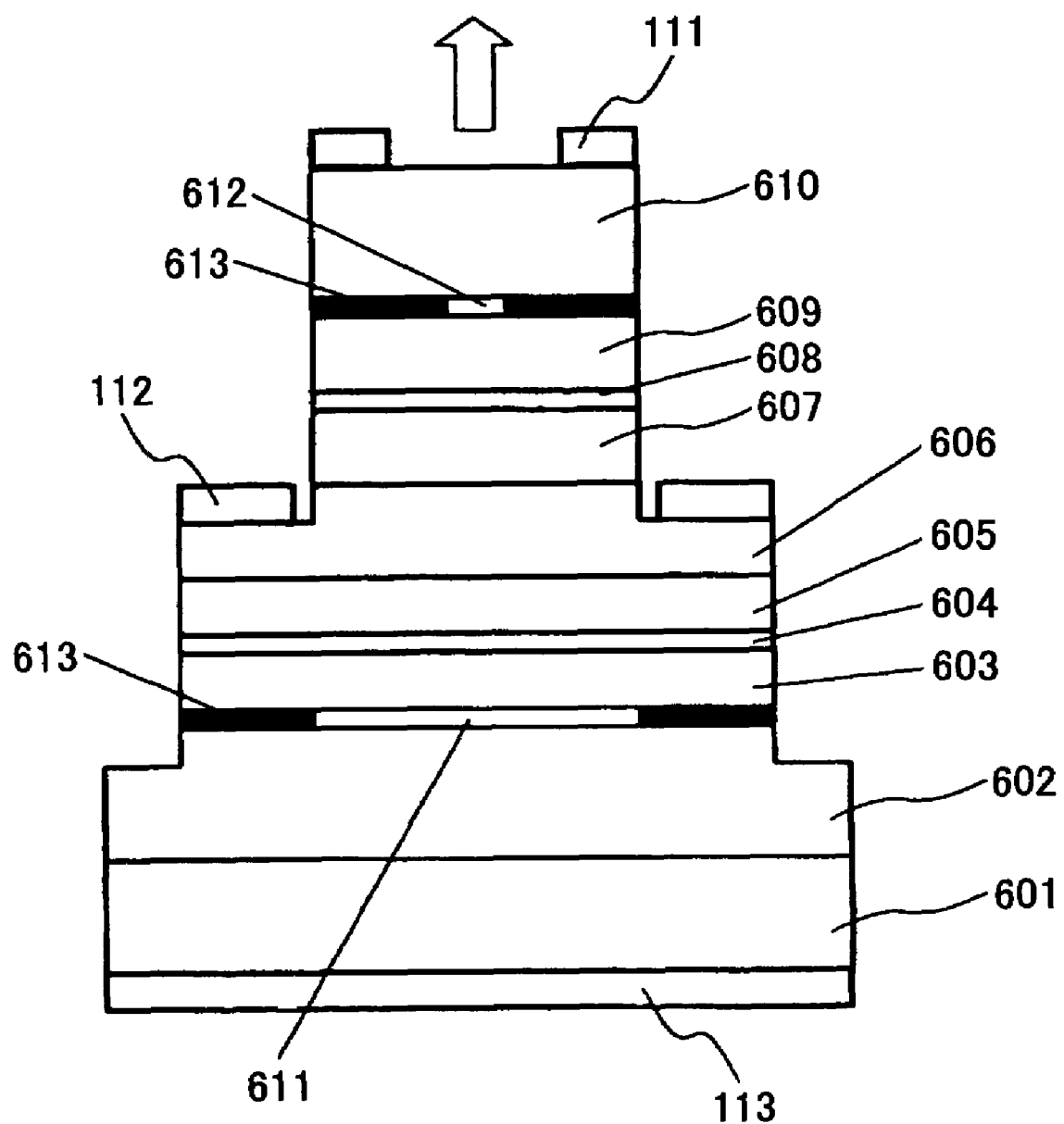
FIG. 6 is a diagram showing the composition of a vertical cavity surface-emitting laser device in another embodiment of the invention.

Next, a description is given of another embodiment of the invention. FIG. 6 shows the composition of a vertical cavity surface-emitting semiconductor laser device (VCSEL) in this embodiment.

Referring to FIG. 6, a lower DBR 602 of the 1st conductivity type, a semiconductor layer 611 containing Al, a 1st spacer layer 603, an optical absorption layer 604, a 2nd spacer layer 605, a DBR 606 of the 2nd conductivity type, a 3rd spacer layer 607, an active layer 608, a 4th spacer layer 609, a semiconductor layer 612 containing Al, and an upper DBR 610 of the 1st conductivity type are deposited sequentially on a semiconductor monocrystal substrate 601 of the 1st conductivity type.

Etching is performed from the surface of the above-mentioned lamination structure to the middle of the DBR 606 of the 2nd conductivity type, and the 1st mesa structure is formed. Etching is performed to the middle of the lower DBR 602 of the 1st conductivity type, and the 2nd mesa structure which is larger in size that the first mesa structure is formed.

The semiconductor layers 611 and 612 containing Al are selectively oxidized, and the Al oxide layer 613 is formed from the sides of the 1st mesa structure and the 2nd mesa structure.

The 1st electrode 111 is formed on the surface of the upper DBR 610 of the 1st conductivity type except for the light emission part. And the 2nd electrode 112 is formed on the 1st mesa structure bottom (the 2nd mesa structure top surface). The 3rd electrode 113 is formed on the batch surface of the substrate 101.

By supplying the forward current between the 1st electrode 111 and the 2nd electrode 112, the carrier is introduced into the active layer 608 and a light is emitted. The absorption edge of the optical absorption layer 604 shifts to the long wavelength side by supplying the reverse bias between the 2nd electrode 112 and the 3rd electrode 113.

Specifically, the semiconductor monocrystal substrate 601 of the 1st conductivity type is constituted by a p type GaAs substrate, and the lower DBR 602 is formed such that a p type GaAs and a p type $Al_{0.9}Ga_{0.1}As$ are laminated alternately with the lamination periodicity number of 30.5. The semiconductor layer 611 containing Al is made of p type AlAs, the 1st spacer layer 603 is made of $Al_{0.2}Ga_{0.8}As$, and the optical absorption layer 604 is made of $GaInAs/Al_{0.2}Ga_{0.8}As$ multiple quantum well structure. And the 2nd spacer layer 605 is made of $Al_{0.2}Ga_{0.8}As$.

The DBR 606 of the 2nd conductivity type is formed such that an n type GaAs and an n type $Al_{0.9}Ga_{0.1}As$ are laminated alternately with the lamination periodicity number of 8.5. The 3rd spacer layer 607 is made of $Al_{0.2}Ga_{0.8}As$, the active layer 608 is made of $GaInAs/Al_{0.2}Ga_{0.8}As$ multiple quantum well structure, and the 4th spacer layer 609 is made of $Al_{0.2}Ga_{0.8}As$. The semiconductor layer 612 containing Al is made of p type AlAs, and the upper DBR 610 is formed such that a p type GaAs and a p type $Al_{0.9}Ga_{0.1}As$ are laminated alternately with the lamination periodicity number of 15.

The Al oxidization region 613 where the p type AlAs layer 612 is selectively oxidized is an insulating layer, and when supplying the forward current between the 1st electrode 111 and the 2nd electrode 112 and introducing the carrier into the active layer 608, the Al oxidization region 613 serves to confine the carrier in the central part of the mesa structure. Although the Al oxidization region 613 where the p type AlAs layer 611 is selectively oxidized forms a capacity, it is connected in series and the capacity of the whole system falls. Therefore, when the voltage applied to the optical absorption layer 604 is modulated while the bias is applied between the electrode 112 and the electrode 113, the CR time constant can be decreased and the electric modulation band when applying the modulated voltage to the optical absorption layer 604 can be raised.

If the p type AlAs layer 611 is oxidized extensively, the electric field applied to the optical absorption layer 604 will fall. Even when the externally applied bias between the electrode 112 and the electrode 113 is the same, the absorption change of the optical absorption layer becomes small. Therefore, it is necessary to form a non-oxidizing region in the central part of the p type AlAs layer 611.

In the present embodiment, the Al oxide layer is used as the insulating region provided in the current confinement unit for the active layer, and in the region which applies the electric field to the optical absorption layer. Alternatively, the air gap structure where the side etching is selectively performed from the side of a specific semiconductor layer, and the high resistance region which is formed by ion implantation may be used instead.

Figure 7:
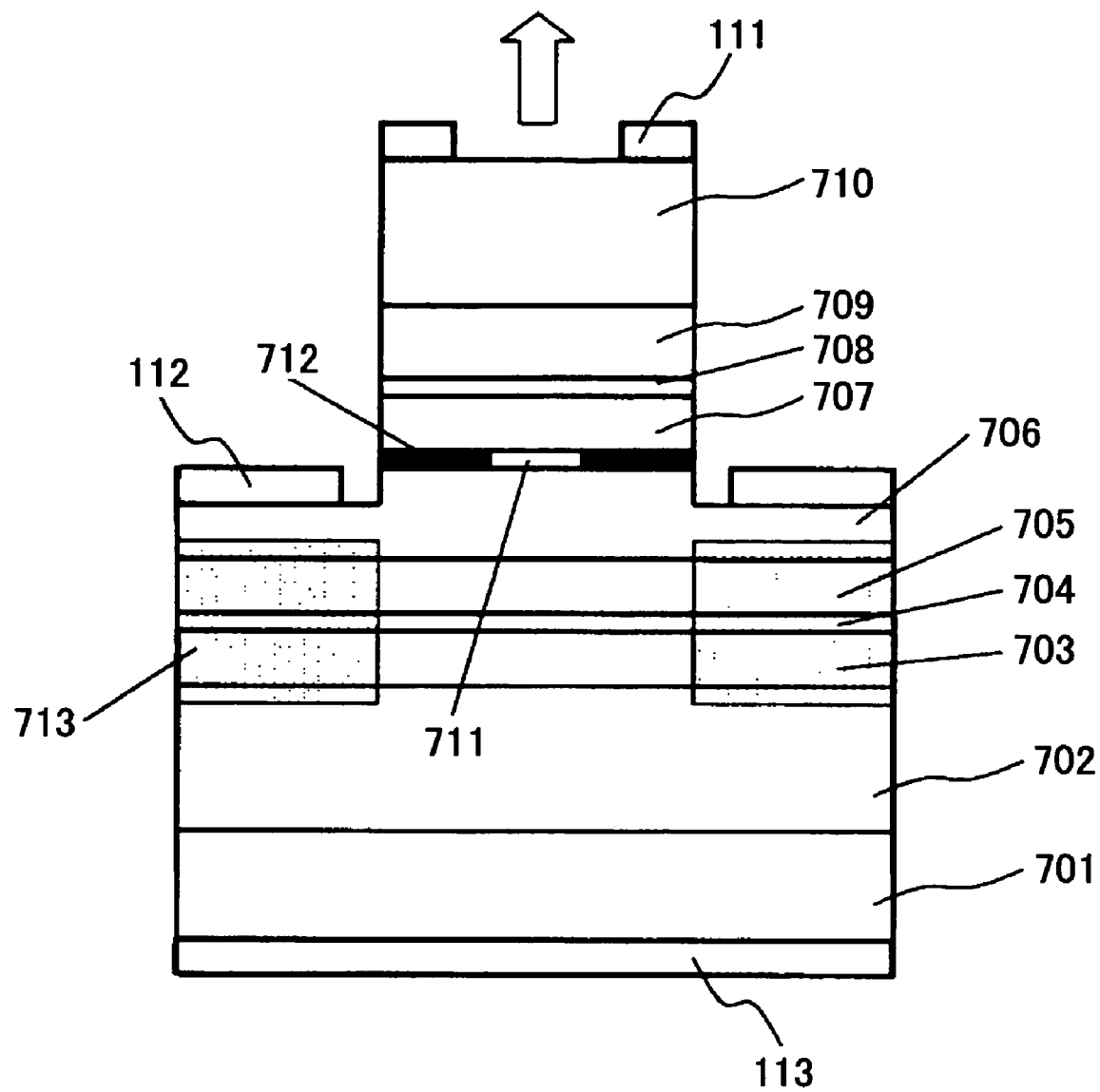
FIG. 7 is a diagram showing the composition of a vertical cavity surface-emitting laser device in another embodiment of the invention.

Next, a description is given of another embodiment of the invention. FIG. 7 shows the composition of a vertical cavity surface-emitting semiconductor laser device (VCSEL) in this embodiment.

Referring to FIG. 7, a lower DBR 702 of the 1st conductivity type, a 1st spacer layer 703, an optical absorption layer 704, a 2nd spacer layer 705, a DBR 706 of the 2nd conductivity type, a semiconductor layer 711 containing Al, a 3rd spacer layer 707, an active layer 708, a 4th spacer layer 709, and an upper DBR 710 of the 1st conductivity type are deposited sequentially on a semiconductor monocrystal substrate 701 of the 1st conductivity type.

Etching is performed from the surface of the above-mentioned lamination structure to the middle of the DBR 706 of the 2nd conductivity type, and the mesa structure is formed. And the semiconductor layer 711 containing Al is selectively oxidized, and the Al oxide layer 712 are formed from the side of the mesa structure.

Ion implantation is performed from the mesa structure bottom, and the high resistance region 713 is formed in the vicinity of the optical absorption layer 704 of the mesa part circumference.

The 1st electrode 111 is formed on the surface of the upper DBR 110 of the 1st conductivity type except for the light emission part. The 2nd electrode 112 is formed on the mesa structure bottom. And the 3rd electrode 113 is formed on the back surface of the substrate 101.

Specifically, the semiconductor monocrystal substrate 701 of the 1st conductivity type is constituted by an n type GaAs substrate, and the lower DBR 702 is formed such that an n type GaAs layer and an n type $Al_{0.9}Ga_{0.1}As$ layer are laminated alternately with the lamination periodicity number of 30.5. The 1st spacer layer 703 is made of $Al_{0.2}Ga_{0.8}As$, the optical absorption layer 704 is made of $GaInAs/Al_{0.2}Ga_{0.8}As$ multiple quantum well structure, and the 2nd spacer layer 705 is made of $Al_{0.2}Ga_{0.8}As$.

The semiconductor layer 711 containing Al is made of a p type AlAs, and the DBR 706 of the 2nd conductivity type is formed such that a p type GaAs layer and a p type $Al_{0.9}Ga_{0.1}As$ layer are laminated alternately with the lamination periodicity number of 8.5. The 3rd spacer layer 707 is made of $Al_{0.2}Ga_{0.8}As$, and the active layer 708 is made of $GaInAs/Al_{0.2}Ga_{0.8}As$ multiple quantum well structure. And the 4th spacer layer 709 is made of $Al_{0.2}Ga_{0.8}As$, and the upper DBR 710 is formed such that an n type GaAs and an n type $Al_{0.9}Ga_{0.1}As$ are laminated alternately with the lamination periodicity number of 15.

In the present embodiment, the Al oxidization confinement structure which oxidizes alternatively the semiconductor layer 711 containing Al from the side is used as a confining unit which confines the current introduced into the active layer 708.

With the Al oxidization confinement structure, the Al oxide layer 712 which is an insulator is made of the oxidizing semiconductor layer 711 containing Al, and the current will not flow through the region which is oxidized. Thereby, the current can be confined to the region which is not oxidized.

Since the refractive index becomes high rather than the region which oxidized, a refractive-index difference is produced in the region which is not oxidized in the transverse direction. Therefore, it has the action which confines light in the region which is not oxidized to the lateral transverse direction, and the diffraction loss inside the VCSEL is suppressed. Thereby, the threshold current of VCSEL is reduced.

The high resistance region 713 formed of ion implantation is used for the half-insulating region provided except for the central part all over the region which applies an electric field to optical absorption layer 704. By carrying out the ion implantation of the heavy metals, such as a proton, oxygen, Cr, and Fe, to the semiconductor layer, the introduced region can become the high resistance and it can confine to the region which has not carried out the ion implantation of the electric field.

In the high resistance region 713 formed of the ion implantation, when compared with the Al oxidization confinement structure, the thickness of the laminating direction becomes much thicker. Therefore, the capacity formed in the high resistance region 713 is reduced compared with the case where the Al oxidization confinement structure is used. The CR time constant when the electric field applied to optical absorption layer 704 is modulated is reduced, and the electric modulation band can be increased.

In the present embodiment, the Al oxidization confinement structure is used as a unit to confine the current introduced into the active layer 708, and what is necessary is the current confinement unit which forms a refractive-index difference in the lateral transverse direction. Alternatively, there is an air gap structure which carries out side etching of the specific semiconductor layer from the side besides the Al oxidization confinement structure which oxidizes alternatively the semiconductor layer containing Al from the side as the current confinement unit by which the refractive-index difference is formed horizontally.

With the air gap structure, the current is confined by flowing only into the semiconductor layer by which side etching is not carried out. And since a refractive index becomes high rather than the etched regions (air, a vacuum, etc.), the semiconductor layer which is not etched has the action which confines light in a level transverse direction.

Figure 8:
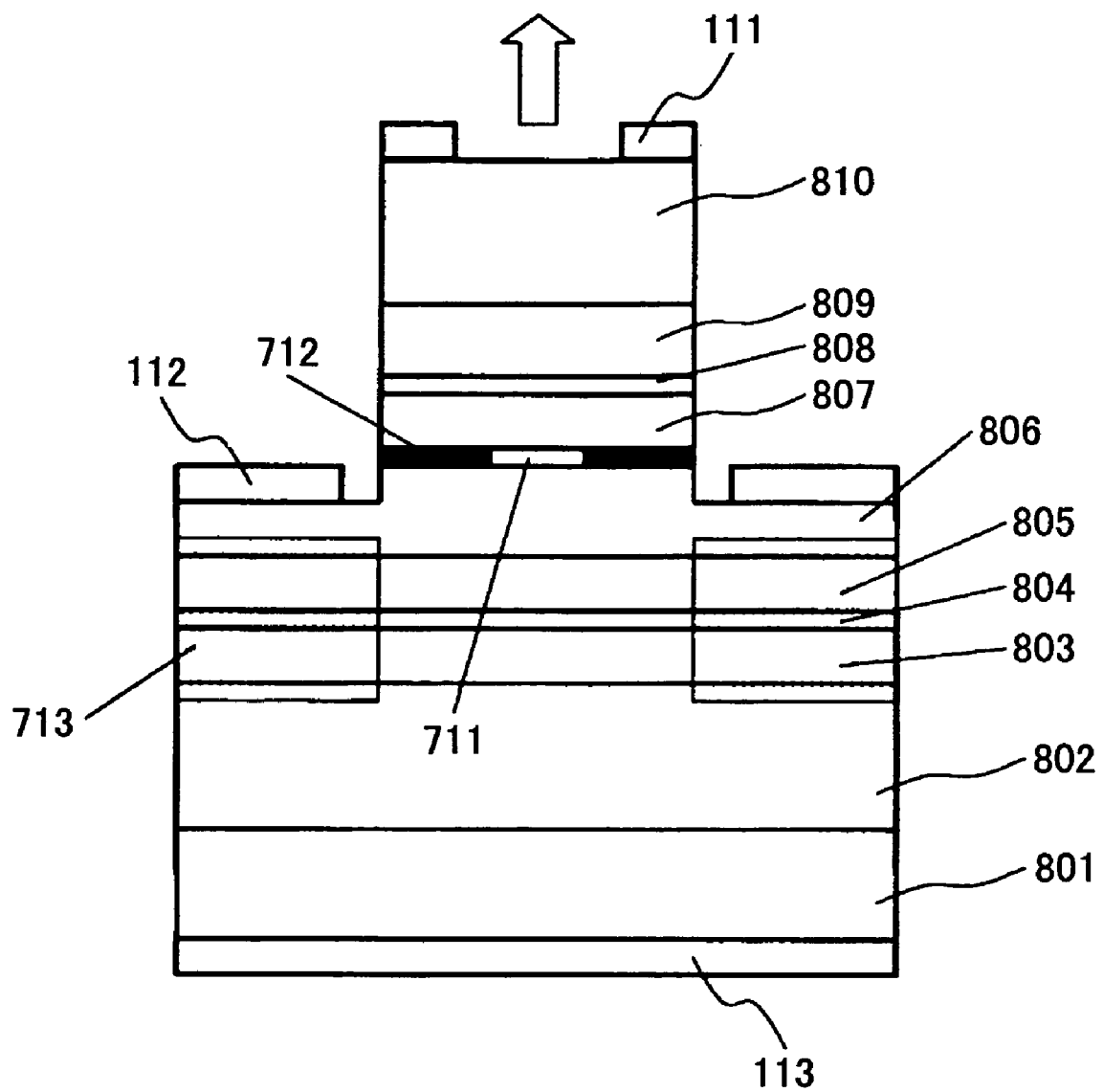
FIG. 8 is a diagram showing the composition of a vertical cavity surface-emitting laser device in another embodiment of the invention.

FIG. 8 shows the composition of a vertical cavity surface-emitting semiconductor laser device (VCSEL) in another embodiment of the invention.

Referring to FIG. 8, on the semiconductor monocrystal substrate 801 of the 1st conductivity type, the lower DBR 802 of the 1st conductivity type, the 1st spacer layer 803, the optical absorption layer 804, the 2nd spacer layer 805, the DBR 806 of the 2nd conductivity type, the semiconductor layer 711 containing Al, the 3rd spacer layer 807, the mixed-crystal semiconductor active layer 808 made of nitrogen and other V group elements in the periodic table, the 4th spacer layer 809, and the upper DBR 810 of the 1st conductivity type are deposited sequentially.

The feature of this embodiment is that the mixed-crystal semiconductor made of nitrogen and other V group elements in the periodic table is used as the material of the active layer 808. Except for this point, the composition and operation are essentially the same as those of the previous embodiment of FIG. 7.

For example, the material of the mixed-crystal semiconductor of nitrogen and other V group elements may include GaNAs, GaInNAs, GaNAsP, GaInNAsP, GaNAsSb, GaInNAsSb, GaNAsPSb, GaInNAsPSb, etc. The above-mentioned mixed-crystal semiconductor is characterized by being a long wavelength region material system in which the crystal growth is possible on the GaAs substrate.

The semiconductor monocrystal substrate 801 of the 1st conductivity type is constituted by an n type GaAs substrate, and the lower DBR 802 is formed such that an n type GaAs layer and an n type $Al_{0.9}Ga_{0.1}As$ layer are laminated alternately with the lamination periodicity number of 35.5. The 1st spacer layer 803 is made of GaAs, the optical absorption layer 804 is made of GaInNAs/GaAs multiple quantum well structure, and the 2nd spacer layer 805 is made of GaAs.

The semiconductor layer 711 containing Al is made of a p type AlAs, and the DBR 806 of the 2nd conductivity type is formed such that a p type GaAs layer and a p type $Al_{0.9}Ga_{0.1}As$ layer are laminated alternately with the lamination periodicity number of 8.5. The 3rd spacer layer 807 is made of GaAs, and the active layer 808 is made of GaInNAs/GaAs multiple quantum well structure. And the 4th spacer layer 809 is made of GaAs, and the upper DBR 810 is formed such that an n type GaAs layer and an n type $Al_{0.9}Ga_{0.1}As$ layer are laminated alternately with the lamination periodicity number of 20. The first resonator and the 2nd resonator which are coupled optically are inserted into the lower DBR 802 and the DBR 806 of the 2nd conductivity type, so that the DBR 806 and the upper DBR 810 of the 2nd conductivity type forms two resonance wavelengths (1290 nm, 1310 nm).

Since the conduction band electron with barrier layers, such as GaAs, shuts up GaInNAs which is the mixed-crystal semiconductor of nitrogen and other V group elements and it can make barrier height high with 300 or more meV, the electronic overflow from the well layer is suppressed and good temperature characteristics can be provided.

It can grow epitaxially on the high reflectivity and DBR of high temperature conductivity which laminated GaAs, AlAs or GaAs, and AlGaAs, and the VCSEL with good performance can be formed in the long wavelength region.

The distribution of silica optical fiber can operate the VCSEL on the wavelength of about 1.31 micrometers which is zero by using the mixed-crystal semiconductor of nitrogen, and other V group elements (such as GaInNAs) for the active region. In this embodiment, the wavelength modulation of VCSEL are carried out between two wavelengths, signal degradation by the wavelength dispersion after silica-optical-fiber transmission can be suppressed by using a 1.3-micrometer band with small wavelength dispersion.

Figure 13A:
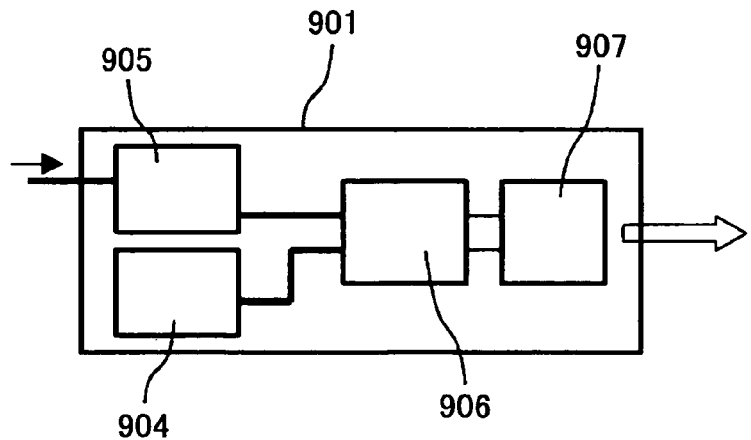
FIG. 13A and FIG. 13B are diagrams showing the composition of an optical transmission module in another embodiment of the invention.

FIG. 13A shows the composition of an optical transmission module in another embodiment of the invention.

Referring to FIG. 13A, the vertical cavity surface-emitting semiconductor laser device (VCSEL) in any of the previously described embodiments is used as the light source 906 in the optical transmission module 901.

The direct current power supply 904 supplies a fixed amount of current to the active layer of VCSEL 906, and is made to carry out the laser emission. The modulation bias power supply 905 modulates the reverse bias applied to the optical absorption layer of the VCSEL 906 according to the electric signal inputted from the outside. Thereby, the oscillation wavelength of the VCSEL can be modulated.

In the wavelength selection unit 907, as for the laser light outputted from VCSEL 906, only the specific selected wavelength is outputted outside. Thereby, a wavelength modulating signal is converted into a light intensity modulating signal.

Figure 13B:
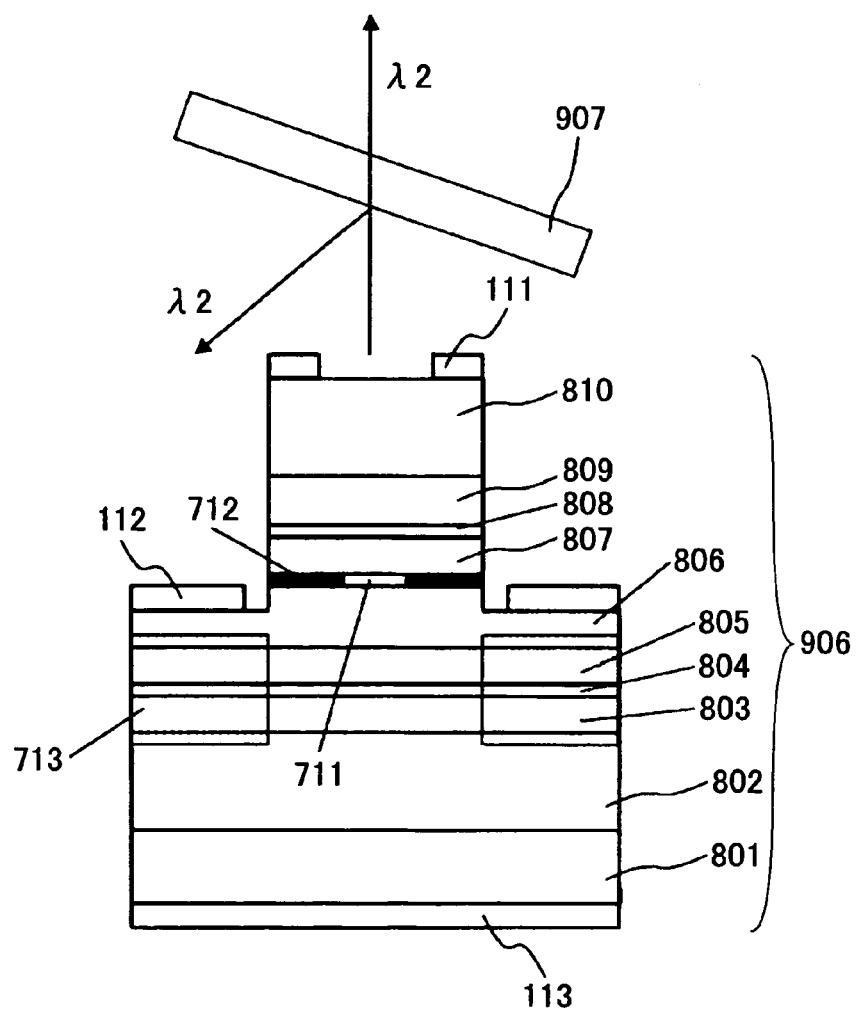

FIG. 13B shows the composition of the VCSEL 906 of the optical transmission module 901, and the composition of the wavelength selection unit 907.

In FIG. 13B, the VCSEL 906 has the same structure as that of the VCSEL in the embodiment of FIG. 8. The light outputted from the VCSEL 906 enters into the wavelength selection unit 907.

A dielectric multilayer film filter is used as the wavelength selection unit 907. In the dielectric multilayer film filter 907, among the two resonance wavelengths (1290 nm, 1310 nm) of the VCSEL 906, it is formed so that the 1290 nm light penetrates, and the 1310 nm light may be reflected. When the dielectric multilayer film filter 907 is penetrated, a laser light is outputted by this, when the electric field is not applied to the optical absorption layer 804, and when the electric field is applied to the optical absorption layer 804, the light intensity is set to OFF state. With respect to the direction perpendicular to the outgoing radiation direction of the VCSEL 906, the dielectric multilayer film filter 907 inclines, is arranged, and has the structure where the light reflected with the dielectric multilayer film filter 907 does not return to the VCSEL 906.

According to the above-mentioned structure, the laser light intensity outputted can be modulated at high speed by carrying out the direct voltage drive of the VCSEL 906 at high speed of 40 Gbps per channel. Therefore, the module size is small and it is possible to provide form the optical transmission module with a low cost.

In this embodiment, the dielectric multilayer film filter is used as the wavelength selection unit 907. Alternatively, a resonator structure, a diffraction grating, an interferometer, etc may be used instead.

Although the example which carried out packaging shows the light source part and the drive circuit to one module in this embodiment, it is also possible to carry out packaging only of the vertical cavity surface-emitting semiconductor laser device (VCSEL) and the wavelength selection unit of any of the previous embodiments, and to constitute a module.

The optical transmission module of this embodiment can be used not only for the serial transmission systems which uses the optical fiber but for the parallel transmission-systems and the wavelength multiplexing transmission systems. It is also possible to use for the space optical transmission system which does not use an optical fiber.

Figure 9:
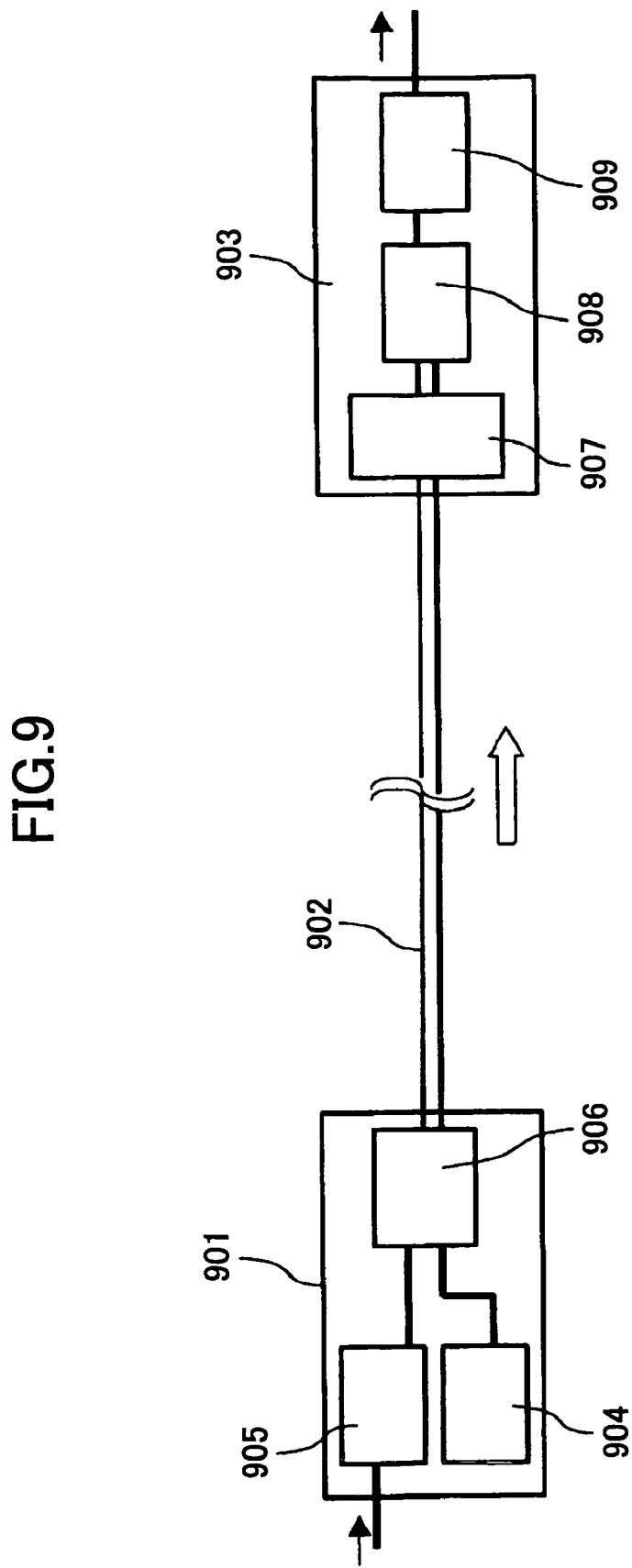
FIG. 9 is a diagram showing the composition of an optical transmission device in another embodiment of the invention.

FIG. 9 shows the composition of an optical transmission device in another embodiment of the invention.

Referring to FIG. 9, in the optical transmission unit 901, the electric signal indicating information is converted into a light signal and it is introduced into the optical fiber cable 902.

The light which guides the optical fiber cable 902 is again converted into an electric signal indicating the original information and it is outputted by the optical receiving unit 903.

In the optical transmission unit 901, the vertical cavity surface-emitting semiconductor laser device (VCSEL) of the previous embodiment of FIG. 8 is used as the light source 906.

The direct current power supply 904 introduces a fixed current into the active layer 808 of the VCSEL 906, and is made to carry out the laser emission. The modulation bias power supply 905 modulates the reverse bias applied to the optical absorption layer 804 of the VCSEL 906 according to the electric signal inputted into the optical transmission unit from the outside. Thereby, the high-speed modulation of the oscillation wavelength of the VCSEL 906 can be carried out with the data-transmission capacity of 40 Gbps per single channel.

In the optical receiving unit 903, the light signal outputted from the optical fiber cable 902 is separated for every wavelength by the wavelength selection unit 907, and the specific selected wavelength is received by the photo detector 908.

A wavelength modulating signal is converted into a light intensity modulating signal by passing along the wavelength selection unit 907. It is converted into the current, signal amplification, waveform shaping, etc. are made by the receiving circuit 909, and the light signal received by the photo detector 908 is outputted from the optical receiving unit 903.

As the wavelength selection unit 907, it is possible to use a multilayer film filter, a resonator structure, a diffraction grating, an interferometer, etc. Although the wavelength selection unit is provided in optical receiving unit 902 in this case of the operation 10 just before photo detector 908, it is also possible between VCSEL 906 and optical fiber cables 902 in optical transmission unit 901 and to provide in the middle of optical fiber cable 902.

Since the VCSEL of FIG. 8 is used as the light source 906 of the optical transmission unit 901 in the optical transmission device of this embodiment, the 40 Gbps light signal transmission is realized without using an external modulator.

Since the large amount of wavelength shifts to change can be taken (for example, 10-20 nm), sufficiently large wavelength modulation can be performed when compared with change of the VCSEL oscillation wavelength by the environmental temperature change. Therefore, the precise temperature control by the electronic cooling element is unnecessary, and it is possible to carry out the manufacture with a low cost. Thereby, the large capacity optical transmission device (for example, 40 Gbps per channel) can be built with a low cost.

Figure 14:
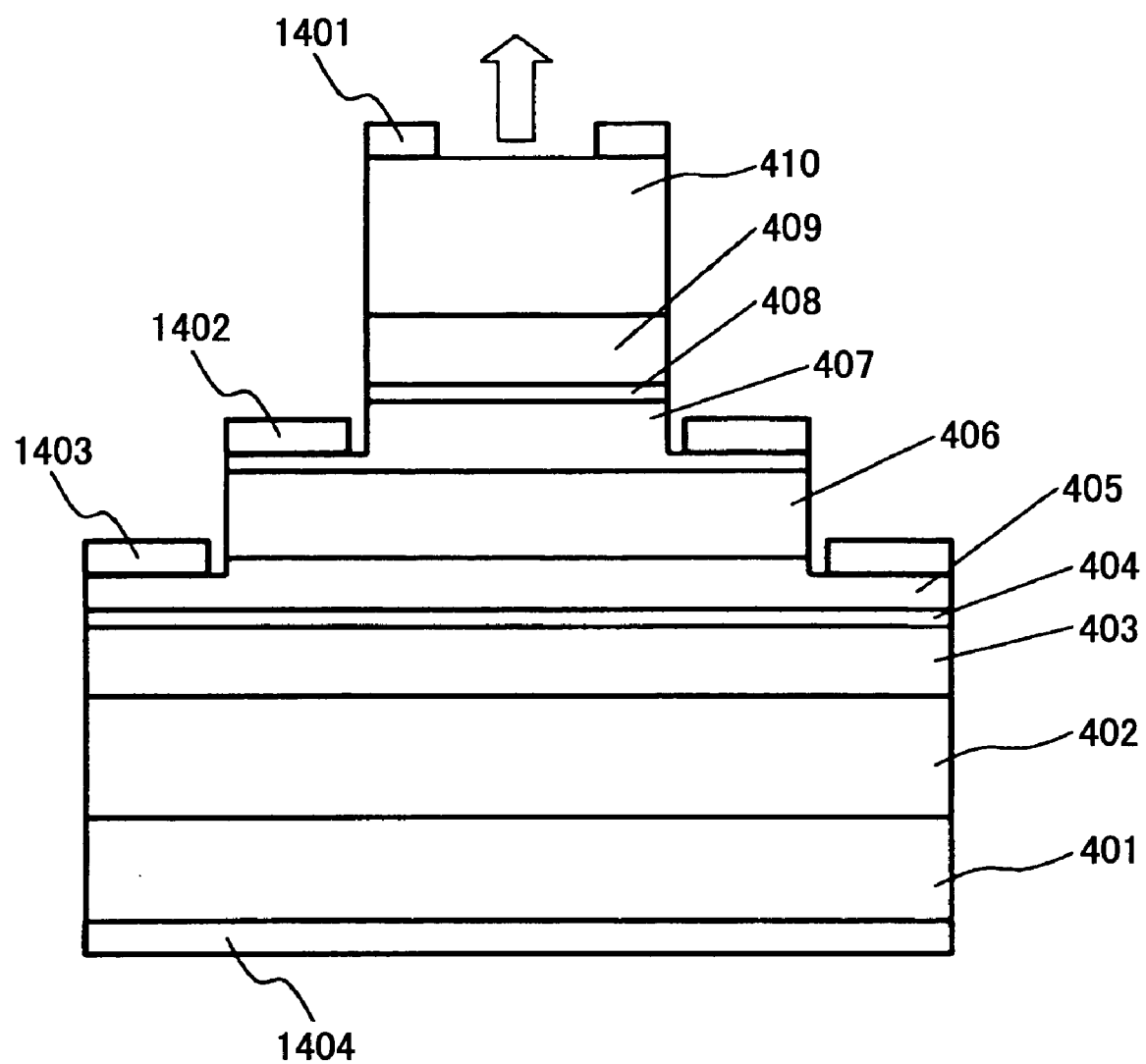
FIG. 14 is a diagram showing the composition of a vertical cavity surface-emitting laser device in another embodiment of the invention.

FIG. 14 shows the composition of a vertical cavity surface-emitting semiconductor laser device (VCSEL) in another embodiment of the invention.

Referring to FIG. 14, on the semiconductor monocrystal substrate 401 of the 1st conductivity type, the lower DBR 402 of the 1st conductivity type, the 1st spacer layer 403, the active layer 404, the 2nd spacer layer 405 of the 2nd conductivity type, the undoped DBR 406, the 3rd spacer layer 407 of the 2nd conductivity type, the optical absorption layer 408, the 4th spacer layer 409, and the upper DBR 410 of the 1st conductivity type are deposited sequentially.

Etching is performed from the surface of the above-mentioned lamination structure to the middle of the 3rd spacer layer 407, and the 1st mesa structure is formed. Etching is performed to the middle of 2nd spacer layer 405, and the 2nd mesa structure which is larger in size than the 1st mesa structure is formed.

The 1st electrode 1401 is formed in the upper DBR 410 surface of the 1st conductivity type except for the light emission part. And the 2nd electrode 1402 is formed in the 1st mesa structure bottom.

The 3rd electrode 1403 is formed in the 2nd mesa structure bottom, and the 4th electrode 1404 is formed in the substrate 401 back surface.

By supplying the forward current between the 3rd electrode 1403 and the 4th electrode 1404, the carrier is introduced into the active layer 404 and light is emitted. The absorption edge of the optical absorption layer 408 shifts to the long wavelength side by supplying the reverse bias between the 1st electrode 1401 and the 2nd electrode 1402.

The feature of this embodiment is that the electric field can be applied to the undoped DBR 406 and the refractive index of the undoped DBR 406 can be changed, by applying the voltage between the 2nd electrode 1402 and the 3rd electrode 1403.

If the refractive index of the undoped DBR 406 is increased by the electric field application, the Bragg wavelength of the undoped DBR 406 shifts to the long wavelength side. Thereby, the two resonance wavelengths which are provided wherein the 1st resonator and 2nd resonator are coupled optically can be shifted. Thereby, the difference between the gain peak wavelength of the active layer 404 and the resonance wavelength, the relation between the reflection spectrum of the upper DBR 410 of the 1st conductivity type and the resonance wavelength, and the difference between the absorption edge wavelength of the optical absorption layer 408 and the resonance wavelength can be adjusted electrically, and the optimization of them is possible. Thereby, the wavelength modulation operation can be stabilized.

In this embodiment, in order to sweep a resonance wavelength, the electric field is applied to the middle DBR 406 and the refractive index is changed. Alternatively, the electric field may be applied to the upper DBR 410 or the lower DBR 402 so that the refractive index is changed.

Figure 15:
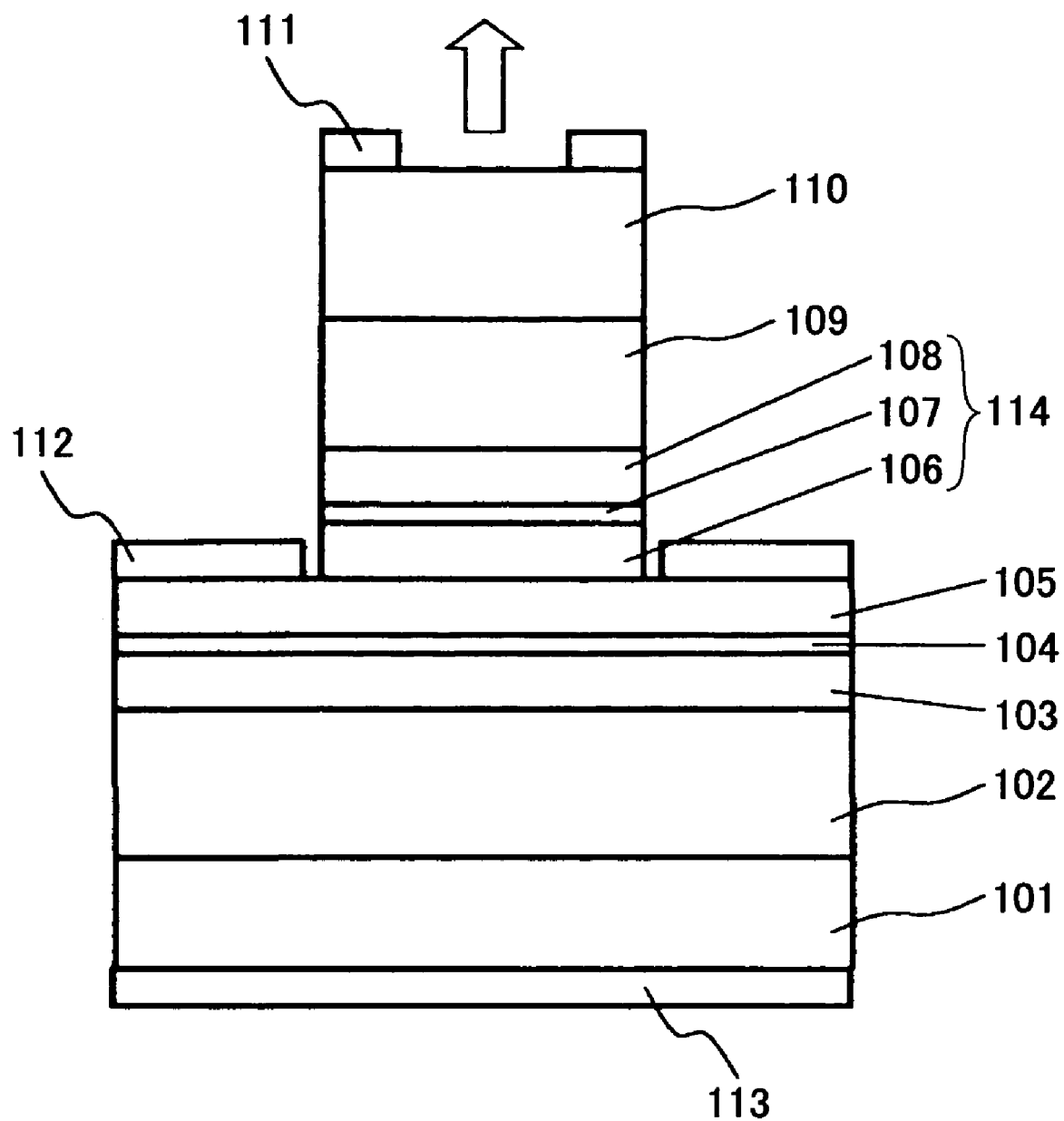
FIG. 15 is a diagram showing the composition of a vertical cavity surface-emitting laser device in another embodiment of the invention.

FIG. 15 shows the composition of a vertical cavity surface-emitting semiconductor laser device (VCSEL) in another embodiment of the invention.

Referring to FIG. 15, the p type lower distribution Bragg reflector (DBR) 102 is laminated on the p type GaAs substrate 101. And the p type lower DBR 102 is formed such that the p type $Al_{0.2}Ga_{0.8}As$ and the p type $Al_{0.9}Ga_{0.1}As$ are laminated alternately with the lamination periodicity number of 30.5.

And, on the p type lower DBR 102, the 1st resonator lower spacer layer 103 of $Al_{0.2}Ga_{0.8}As$, the active layer 104 of $GaAs/Al_{0.2}Ga_{0.8}As$ multiple quantum well (MQW), the 1st resonator upper spacer layer 105 of n type $Al_{0.2}Ga_{0.8}As$, and the middle DBR 114 are laminated one by one.

The middle DBR 114 is formed such that $Al_{0.2}Ga_{0.8}As$ and $Al_{0.9}Ga_{0.1}As$ are laminated alternatively with the lamination periodicity number of 10.5. And the optical absorption layer 107 of $Al_{0.08}Ga_{0.92}As$ with a thickness of 30 nm is formed in the middle of the middle DBR 114. And in the middle DBR 114, the lower surface of the $Al_{0.08}Ga_{0.92}As$ optical absorption layer 107 is the n type middle DBR 106, and the upper surface of the $Al_{0.08}Ga_{0.92}As$ optical absorption layer 107 is the p type middle DBR 108.

On the p type middle DBR 108, the 2nd resonator spacer layer 109 of p type $Al_{0.2}Ga_{0.8}As$ and the p type upper DBR 109 are laminated. The p type upper DBR 110 is formed such that a p type $Al_{0.2}Ga_{0.8}As$ layer and a p type $Al_{0.9}Ga_{0.1}As$ layer are laminated alternately with the lamination periodicity number of 15.

The region between the p type lower DBR 102 and the n type middle DBR 106 serves as the 1st resonator. The region between the p type middle DBR 108 and the p type upper DBR 110 serves as the 2nd resonator.

In this embodiment, the 1st resonator and the 2nd resonator are formed with a one wavelength resonator, and the optical resonator length is made the same. For example, the wavelength corresponding to the optical distance of the resonator length is 850 nm. Although the DBR 102, 106, 108, 110 are formed by laminating alternately the layers having different refractive indexes and the optical thickness equal to ¼ of the wavelength, the wavelength corresponding to DBR is also 850 nm.

The active layer 104 is formed so that it may be located in the center of the 1st resonator. The optical absorption layer 107 is formed so that it may be located at an equal distance from the upper end of the 1st resonator upper spacer layer 105 of n type $Al_{0.2}Ga_{0.8}As$ and from the lower end of the 2nd resonator spacer layer 109 of p type $Al_{0.2}Ga_{0.8}As$.

Etching is performed from the above-mentioned lamination structure surface to the 1st resonator upper spacer layer 105 of n type $Al_{0.2}Ga_{0.8}As$, and the mesa structure is formed. And the 1st electrode 111 is formed in the p type upper DBR 110 surface except for the light emission part. The 2nd electrode 112 is formed on the 1st resonator upper spacer layer 105 of n type $Al_{0.2}Ga_{0.8}As$ on the bottom of the mesa structure. The 3rd electrode 113 is formed on the back surface of the p type substrate 101.

With the above-mentioned structure, the wavelength corresponding to the optical distance of each layer is 850 nm. Since the 1st resonator and the 2nd resonator are coupled optically via the middle DBR 114, they form two resonance wavelengths. In this embodiment, the two resonance wavelengths are 843 nm and 857 nm.

If the forward bias is applied between the 2nd electrode 112 and the 3rd electrode 113, the current is introduced into the active layer 104 and light is emitted. The active layer 104 is formed so that the gain peak wavelength may be set to 865 nm, and the gain of the active layer 104 at the resonance wavelength (857 nm) on the side of long wavelength is high rather than that at the resonance wavelength (843 nm) on the side of short wavelength. Therefore, the VCSEL usually carries out the laser emission with the resonance wavelength (857 nm) on the side of long wavelength.

The optical absorption layer 107 is formed so that the absorption edge thereof when no electric field is applied is set to 830 nm, and it is transparent to the two resonance wavelengths of 843 nm and 857 nm.

By supplying the reverse bias between the 1st electrode 111 and the 2nd electrode 112, an electric field is applied to the optical absorption layer 107, and the absorption edge of the optical absorption layer shifts to the long wavelength side by about 40 nm according to an Franz-Keldish effect. Thereby, the absorption coefficient of the optical absorption layer 107 is increased to the two resonance wavelengths.

The optical absorption layer 107 is formed so that it may be located at an equal distance from the upper end of the 1st resonator upper spacer layer 105 of n type $Al_{0.2}Ga_{0.8}As$ and from the lower end of the 2nd resonator spacer layer 109 of p type $Al_{0.2}Ga_{0.8}As$. And the lamination periodicity number of the middle DBR 104 is set to 10.5.

At the resonance wavelength on the side of short wavelength, the electric field intensity in the central part of the 1st resonator and that in the central part of the 2nd resonator are opposite in polarity. At the resonance wavelength on the side of long wavelength, the electric field intensity in the central part of the 1st resonator and that in the central part of the 2nd resonator have a same polarity. Therefore, at the resonance wavelength on the side of short wavelength, the optical absorption layer 107 is located in the node of the electric field intensity distribution inside the VCSEL, and at the resonance wavelength on the side of long wavelength, it is located in the anti-node of the electric field intensity distribution. Thus, the optical absorption layer 107 has absorption to both the resonance wavelength on the side of long wavelength and the resonance wavelength on the side of short wavelength when the electric field is applied. Since the rate coupled with the light inside the VCSEL at the resonance wavelength on the side of long wavelength is larger, it has a larger absorption loss to the resonance wavelength on the side of long wavelength. Thereby, the oscillation of the resonance wavelength on the side of long wavelength is suppressed.

If the oscillation of the resonance wavelength on the side of long wavelength is suppressed, the carrier currently consumed by the oscillation gain of the resonance wavelength on the side of long wavelength will decrease, and the gain to the resonance wavelength on the side of short wavelength will increase. Thereby, the laser light output intensity at the resonance wavelength on the side of short wavelength increases.

Therefore, the current introduced into the active layer is continuously introduced with a steady value higher than the laser oscillation threshold current, and switching operation of the oscillation wavelength of the VCSEL can be carried out by modulating the electric field applied to the optical absorption layer between the resonance wavelength on the side of long wavelength and the resonance wavelength on the side of short wavelength.

The speed of the absorption coefficient change when applying an electric field to optical absorption layer 107 is higher than the relaxation oscillation frequency of the semiconductor laser, and it is possible to modulate the absorption coefficient at high speed of 10 GHz or higher. The mutual gain modulation to which the gain of the wavelength of another side is changed is used by changing the gain of one wavelength, and switching operation of the oscillation wavelength can be carried out at speed of 10 GHz or higher.

Since the laser light is always outputted with one of the two resonance wavelengths, the carrier density change in the active layer can be suppressed, and the modulation speed can be made to increase, although the oscillation wavelength is switched.

In the above embodiment, the VCSEL suitable for large capacity transmission with the data-transmission capacity of greater than 10 Gbps per channel can be formed with a single element without using an external modulator.

In this embodiment, although the active layer 104 is formed in the 1st resonator on the side of the substrate, it is also possible to form the active layer 104 in the 2nd resonator.

In the vertical cavity surface-emitting semiconductor laser device of FIG. 15, the 1st multilayer film reflector, the 1st resonator, the 2nd multilayer film reflector, the 2nd resonator, and the 3rd multilayer film reflector are formed one by one on the substrate. And the active layer is provided in at least one of the 1st resonator and the 2nd resonator. This vertical cavity surface-emitting semiconductor laser device has the two different resonant wavelengths.

The optical absorption layer is provided in the 2nd multilayer film reflector at an equidistant position from the 1st resonator and from the 2nd resonator, and by modulating the electric field applied to the optical absorption layer, it is constituted so that the switching operation of the laser oscillation wavelength may be carried out between the two resonant wavelengths.

Figure 23:
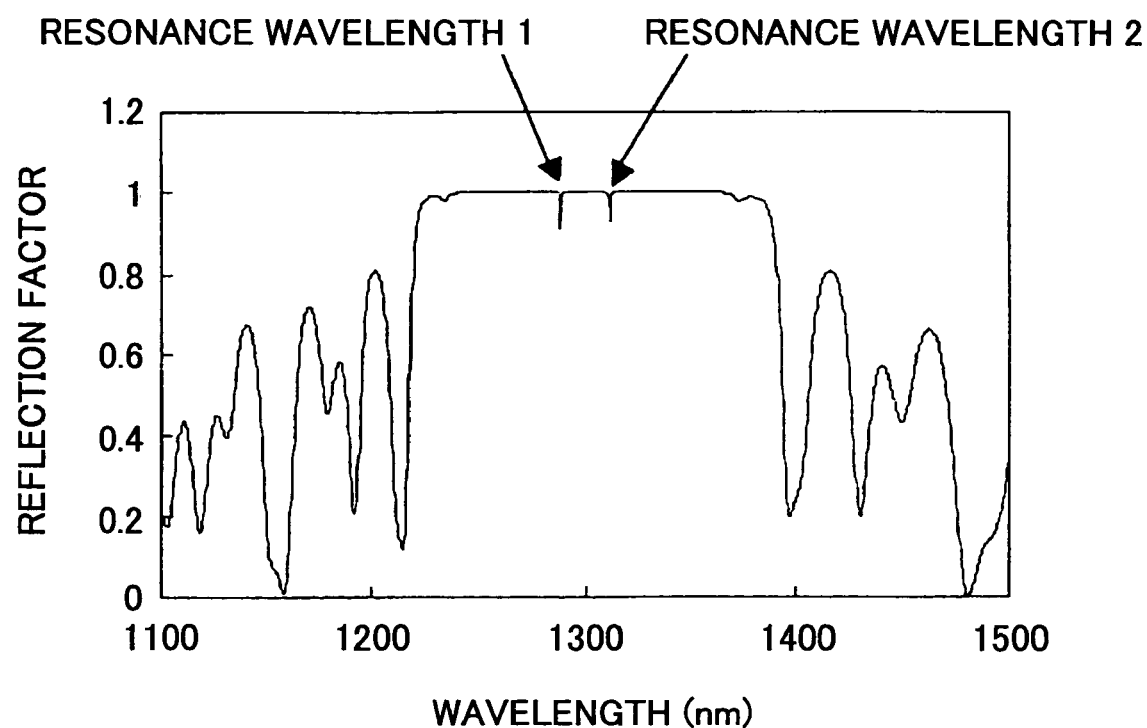
FIG. 23 is a diagram showing an example of the reflection spectrum of the vertical cavity surface-emitting laser having two resonators of FIG. 15.

Even when the resonator length is equal, the 1st resonator and the 2nd resonator are coupled optically through the 2nd reflector multilayer film Bragg (DBR) between the 1st resonator and the 2nd resonator. And the 1st resonator and the 2nd resonator form the two resonant wavelengths in the short wavelength and long wavelength side on both sides of the wavelength corresponding to the resonator length (see FIG. 23).

In the structure where the optical absorption layer is provided in the 2nd DBR at an equidistant position from the upper surface of the 1st resonator and from the lower surface of the 2nd resonator, the electric field intensity distribution inside the VCSEL at the resonant wavelength is calculated. It is found out that at one of the two resonant wavelengths the electric field intensity in the central part of the 1st resonator and that in the central part of the 2nd resonator have a same polarity, and at the other resonant wavelength the electric field intensity in the central part of the 1st resonator and that in the central part of the 2nd resonator are opposite in polarity.

Figure 24A:
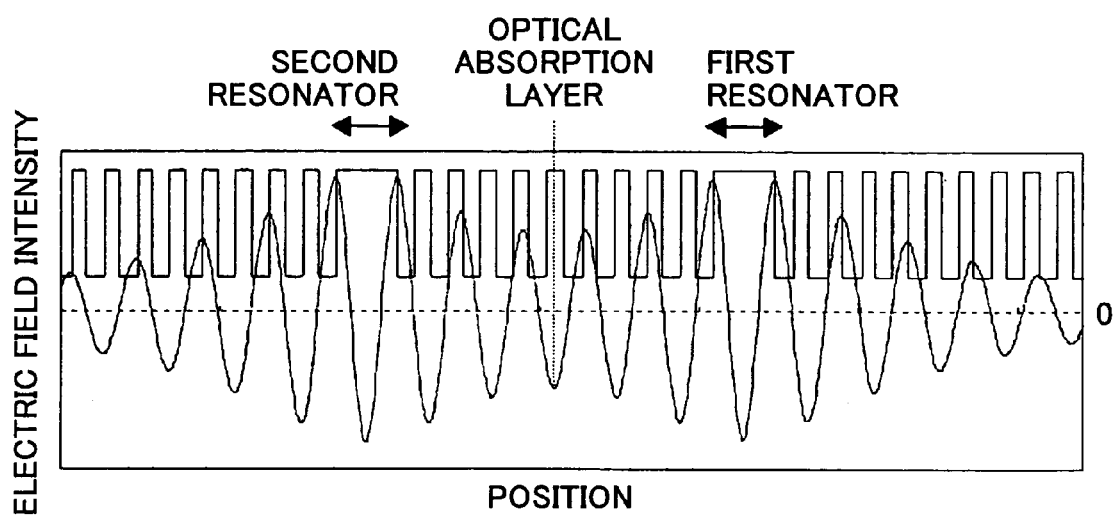
FIG. 24A and FIG. 24B are diagrams showing the electric field intensity distribution of the vertical cavity surface-emitting laser device of FIG. 15.

Moreover, it is found out that the optical absorption layer is located in the anti-node of the electric field intensity distribution in the resonant wavelength from which the electric field intensity in the central part of the 1st resonator and that in the central part of the 2nd resonator serves as a same polarity (FIG. 24A).

Figure 24B:
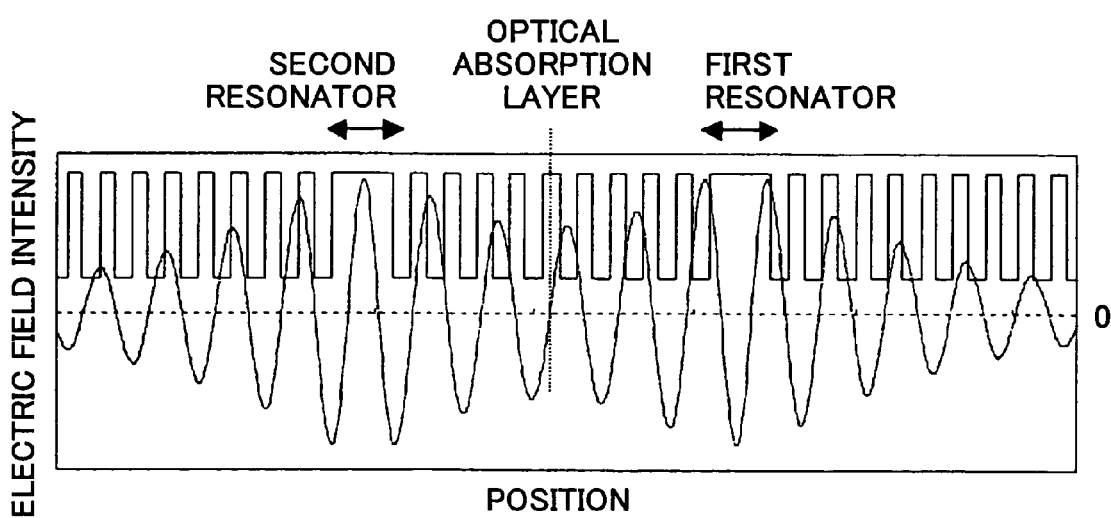

On the other hand, in the resonant wavelength from which the electric field intensity in the central part of the 1st resonator and that in the central part of the 2nd resonator serves as opposite in polarity, it is found out that the optical absorption layer is located in the node of the electric field intensity distribution (FIG. 24B).

For example, when each of the 1st resonator and the 2nd resonator is formed from one wavelength resonator, respectively, and the lamination periodicity number of the 2nd DBR provided between the 1st resonator and the 2nd resonator is set to 1.5, 3.5, 5.5, 7.5, 9.5, the electric field intensity, at the resonant wavelength on the side of short wavelength, in the central part of the 1st resonator and that in the central part of the 2nd resonator have a same polarity, and the electric field intensity, at the resonant wavelength on the side of long wavelength, in the central part of the 1st resonator and that in the central part of the 2nd resonator are opposite in polarity.

When the lamination periodicity number of the 2nd DBR provided between the 1st resonator and the 2nd resonator is set to 2.5, 4.5, 6.5, 8.5, 10.5, . . . , the electric field intensity, at the resonant wavelength on the side of short wavelength, in the central part of the first resonator and that in the central part of the 2nd resonator are opposite in polarity, and the electric field intensity, at the resonant wavelength on the side of long wavelength, in the central part of the first resonator and that in the central part of the 2nd resonator have a same polarity.

The electric field intensity distribution inside the VCSEL has been calculated using the characteristics matrix method. The resonance conditions are determined by calculating the combination of the active layer gain and the wavelength when both the incidence electric field intensity on the uppermost surface of the lamination structure and that on the lowest surface of the lamination structure are zero, and the combination of active layer gain.

When the optical absorption layer is provided in the 2nd DBR at an equidistant position from the 1st resonator and the 2nd resonator and the optical absorption layer has the absorption at both the two resonant wavelengths, the rate coupled with the light inside the VCSEL at the resonant wavelength with which the electric field intensity in the central part of the first resonator and that in the central part of the 2nd resonator have a same polarity is larger than that at the resonant wavelength with which the electric field intensity in the central part of the first resonator and that in the central part of the 2nd resonator are opposite in polarity, and a large absorption loss can be provided.

In the present embodiment, when the electric field is not applied to the optical absorption layer, the absorption edge of the optical absorption layer is formed so that it might become short wavelength rather than the resonant wavelength on the side of short wavelength.

When no electric field is applied to the optical absorption layer, the optical absorption layer is almost transparent to the light of two resonant wavelengths. In the state where an electric field is not applied to the optical absorption layer, the VCSEL structure is formed so that the resonant wavelength from which the electric field intensity in the central part and the central part of the 2nd resonator of the 1st resonator serves as a same polarity beforehand may have priority and oscillate.

On the other hand, if an electric field is applied to the optical absorption layer, the absorption edge of the optical absorption layer will shift to the long wavelength side according to the Franz-Keldish effect.

In this embodiment, the absorption edge of the optical absorption layer at the time of electric field application forms so that it may become the resonant wavelength on the side of long wavelength, equivalent, or long wavelength. Therefore, the optical absorption layer has a large absorption coefficient to the light of two resonant wavelengths. However, the rate coupled with the light inside VCSEL, the direction of the resonant wavelength from which the electric field intensity in the central part and the central part of the 2nd resonator of the 1st resonator serves as a same polarity becomes larger than the resonant wavelength from which the electric field intensity in the central part and the central part of the 2nd resonator of the 1st resonator serves as opposite in polarity, the electric field intensity in the central part and the central part of the 2nd resonator of the 1st resonator will do large absorption loss to the resonant wavelength used as a same polarity.

Thereby, when the electric field is applied to the optical absorption layer, the oscillation of the resonant wavelength from which the electric field intensity in the central part and the central part of the 2nd resonator of the 1st resonator serves as a same polarity is suppressed.

If the oscillation of the resonant wavelength from which the electric field intensity in the central part and the central part of the 2nd resonator of the 1st resonator serves as a same polarity is suppressed. Since the gain of the resonant wavelength of another side increases instead of the carrier currently consumed by the oscillation gain of the resonant wavelength from which the electric field intensity in the central part and the central part of the 2nd resonator of the 1st resonator serves as a same polarity decreasing. The laser light output intensity of the resonant wavelength from which the electric field intensity in the central part and the central part of the 2nd resonator of the 1st resonator serves as opposite in polarity increases.

This introduces in continuously the current introduced into an active layer with the steady value higher than laser oscillation threshold current, and switching operation of the oscillation wavelength of VCSEL can be carried out between two resonant wavelengths by modulating the electric field applied to the optical absorption layer.

The speed of the absorption coefficient change when applying an electric field to an optical absorption layer is higher than the relaxation oscillation frequency of a semiconductor laser, and it is possible to modulate an absorption coefficient at high speed above 10 GHz. The mutual gain modulation to which the gain of the wavelength of another side is changed are used by changing the gain of one wavelength, and switching operation of the oscillation wavelength can be carried out at speed of 10 GHz or more.

And since the laser light is always outputted with one of resonant wavelength, the carrier density change in an active layer can be suppressed, and a modulation rate can be made to increase, although the oscillation wavelength is switched in this embodiment.

With the 1st above-mentioned form, it forms so that it may become short wavelength and may serve as resonant wavelength on the side of long wavelength, equivalent, or long wavelength rather than the resonant wavelength on the side of short wavelength at the time of electric field application, when the absorption edge of an optical absorption layer does not apply an electric field.

Namely, since the electric field intensity in the central part and the central part of the 2nd resonator of the 1st resonator needs to give priority to the resonant wavelength used as a same polarity over an optical absorption layer in the state where an electric field is not applied and it is necessary to oscillate it in this embodiment. As for the optical absorption layer absorption edge when not applying an electric field to an optical absorption layer, it is more preferred than the resonant wavelength from which the electric field intensity in the central part and the central part of the 2nd resonator of the 1st resonator serves as a same polarity that it is short wavelength.

Since the electric field intensity in the central part and the central part of the 2nd resonator of the 1st resonator needs to control the oscillation of the resonant wavelength used as a same polarity where an electric field is applied to an optical absorption layer, as for the optical absorption layer absorption edge when applying an electric field to an optical absorption layer, it is preferred that the electric field intensity in the central part and the central part of the 2nd resonator of the 1st resonator is the resonant wavelength used as a same polarity, equivalent, or long wavelength.

In this embodiment, the optical absorption layer is provided in an equidistant position from the 1st resonator and 2nd resonator in 2nd DBR. Although it is considered as the feature, if the absorption loss difference which the optical absorption layer to which the electric field is applied gives to the light of two resonant wavelength is large to the grade changed in the oscillating condition of two resonant wavelength even when it is in the position (equidistant position) slightly shifted, the wavelength switching operation can be caused. Preferably, the optical absorption layer needs to be located within the optical path length corresponding to ⅛ wave from the position of the 1st resonator and 2nd resonator to the equal distance in 2nd DBR so that the phase shift of the optical stationary wave in the position of an optical absorption layer may become large with two resonant wavelength.

Figure 16:
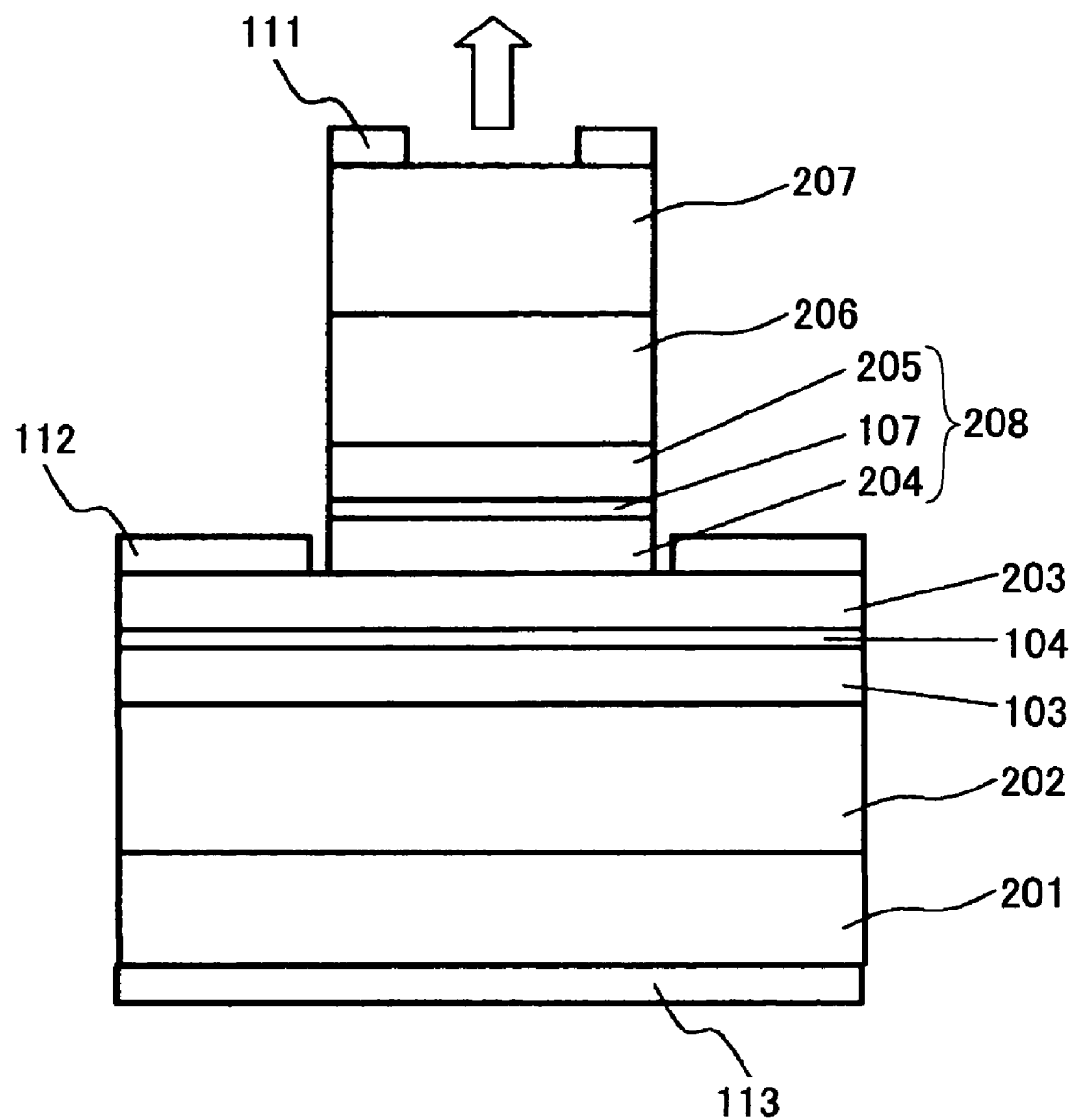
FIG. 16 is a diagram showing the composition of a vertical cavity surface-emitting laser device in another embodiment of the invention.

FIG. 16 shows the composition of a vertical cavity surface-emitting semiconductor laser device (VCSEL) in another embodiment of the invention.

In FIG. 16, the same polarity is given to the same part as FIG. 15.

Referring to of FIG. 16, the n type lower distribution Bragg reflector (DBR) 202 is formed on the n type GaAs substrate 201. The n type lower DBR 202 laminates n type $Al_{0.2}Ga_{0.8}As$ and 30.5 cycles of n type $Al_{0.9}Ga_{0.1}As$ alternately, and is formed. And on the n type lower DBR 202, the 1st resonator of $Al_{0.2}Ga_{0.8}As$ lower spacer layer 103, GaAs/$Al_{0.2}Ga_{0.8}As$ MQW active layer 104, the 1st resonator of p type $Al_{0.2}Ga_{0.8}As$, the upper spacer layer 203, and the middle DBR 208 are laminated one by one.

The middle DBR 208 laminates $Al_{0.2}Ga_{0.8}As$ and 9.5 cycles of $Al_{0.9}Ga_{0.1}As$ alternately, and is formed. And $Al_{0.08}Ga_{0.92}As$ optical absorption layer 107 of 30 nm of layer thickness is formed in the middle of the middle DBR 208. And in the middle DBR 208, the lower surface of $Al_{0.08}Ga_{0.92}As$ optical absorption layer 107 is the p type middle DBR 204, and the upper surface of $Al_{0.08}Ga_{0.92}As$ optical absorption layer 107 is the n type middle DBR 205.

On the n type middle DBR 205, the 2nd resonator spacer layer 206 of n type $Al_{0.2}Ga_{0.8}As$ and upper DBR 207 are laminated. The upper DBR 207 laminates n type $Al_{0.2}Ga_{0.8}As$ and 15 cycles of n type $Al_{0.9}Ga_{0.1}As$ alternately, and is formed.

The region between n type lower DBR 202 and the p type middle DBR 204 serves as the 1st resonator. The region across which it faced by the n type middle DBR 205 and upper DBR 207 serves as the 2nd resonator.

In this embodiment, the 1st resonator and the 2nd resonator are formed with a one wavelength resonator, and the optical resonator length is made the same. For example, the wavelength corresponding to the optical distance of resonator length is 850 nm.

By the optical thickness with a wavelength of 850 nm of ¼, the lower DBR 202 and the middle DBR 204,205 laminate an $Al_{0.2}Ga_{0.8}As$ layer and an $Al_{0.9}Ga_{0.1}As$ layer alternately, and form them. On the other hand, by the optical thickness with a wavelength of 860 nm of ¼, the upper DBR 207 laminated the $Al_{0.2}Ga_{0.8}As$ layer and the $Al_{0.9}Ga_{0.1}As$ layer alternately, and formed them.

The active layer 104 is formed so that it may be located in the center in the 1st resonator. The optical absorption layer 107 is formed so that it may be located in an equal distance from the upper end of the 1st resonator of p type $Al_{0.2}Ga_{0.8}As$ the upper spacer layer 203, and the lower end of the 2nd resonator spacer layer 206 of n type $Al_{0.2}Ga_{0.8}As$.

Etching is performed from the above-mentioned lamination structure surface to the 1st resonator of p type $Al_{0.2}Ga_{0.8}As$ the upper spacer layer 203, and the mesa structure is formed. And the 1st electrode 111 is formed in the upper DBR 207 surface except for the light emission part. The 2nd electrode 112 is formed on the 1st resonator of p type $Al_{0.2}Ga_{0.8}As$ the upper spacer layer 203 at the bottom of the mesa structure. The 3rd electrode 113 is formed in the n type substrate 101 back surface.

In this embodiment, the two resonance wavelength which the 1st resonator and 2nd resonator coupled optically, and is formed is 845 nm and 860 nm. The active layer 104 set gain peak wavelength to 852 nm, and it formed it so that the resonance wavelength (845 nm) on the side of short wavelength and the resonance wavelength (860 nm) on the side of long wavelength might make the almost same gain.

The resonance wavelength (845 nm) on the side of short wavelength is close to the center wavelength of 850 nm of the high reflexogenic-zone region of DBR because the Bragg wavelength of the upper DBR 207 shall be 860 nm. It has the reflection loss whose resonance wavelength (845 nm) on the side of short wavelength is lower than the resonance wavelength (860 nm) on the side of long wavelength.

Therefore, the VCSEL usually carries out the laser emission with the resonance wavelength (845 nm) on the side of short wavelength.

The optical absorption layer 107 is formed so that the absorption edge when not applying an electric field may be set to 830 nm, and it is transparent to two resonance wavelength of 840 nm, and 855 nm both.

By supplying the reverse bias between the 1st electrode 111 and the 2nd electrode 112, an electric field is applied to optical absorption layer 107, and the absorption edge of an optical absorption layer shifts to the about 40 nm long wavelength side according to an Franz-Keldish effect. Thereby, an absorption coefficient increases optical absorption layer 107 to two resonance wavelength.

The optical absorption layer 107 is formed so that it may be located in an equal distance from the upper end of the 1st resonator of p type $Al_{0.2}Ga_{0.8}As$ the upper spacer layer 203, and the lower end of the 2nd resonator spacer layer 206 of n type $Al_{0.2}Ga_{0.8}As$, and it made lamination periodicity number of the middle DBR 208 9.5 cycles.

Thereby, with the resonance wavelength on the side of short wavelength, optical absorption layer 107 is located in the anti-node of the electric field intensity distribution inside VCSEL, and is located in the node of the electric field intensity distribution inside VCSEL with the resonance wavelength on the side of long wavelength. Therefore, the optical absorption layer 107 has absorption to both the resonance wavelength on the side of long wavelength, and the resonance wavelength on the side of short wavelength, if an electric field is applied, but since the resonance wavelength on the side of short wavelength of the rate coupled with the light inside VCSEL is larger, it serves as a large absorption loss to the resonance wavelength on the side of short wavelength. Thereby, the oscillation of the resonance wavelength on the side of short wavelength is suppressed.

If the oscillation of the resonance wavelength on the side of short wavelength is suppressed, the carrier currently consumed by the oscillation gain of the resonance wavelength on the side of short wavelength will decrease, and the gain to the resonance wavelength on the side of long wavelength will increase. Thereby, the laser light output intensity of the resonance wavelength on the side of long wavelength increases.

Therefore, the current introduced into an active layer is continuously introduced in with the steady value higher than the laser oscillation threshold current, and switching operation of the oscillation wavelength of VCSEL can be carried out by modulating the electric field applied to the optical absorption layer between the resonance wavelength on the side of short wavelength, and the resonance wavelength on the side of long wavelength.

In order to reduce the threshold current of VCSEL, it is necessary to make lower DBR 202 and the upper DBR 207 into a high reflectivity, and they need to increase the lamination cycle of a high refractive index layer and a low refractive index layer which constitutes DBR.

On the other hand, the middle DBR208 provided between the 1st resonator and the 2nd resonator needs to lessen lamination periodicity number for example, with 9.5 cycles in order to combine two resonators optically.

The lamination of the semiconductor layer from which a refractive index differs will form a hetero barrier in an interface. In a semiconductor layer, since the effective mass of a hole is much larger than the electronic effective mass, the hole is difficult to tunnel the barrier. Therefore, the resistance becomes high rather than DBR in which resistance of DBR which laminated the p type semiconductor laminated the n-type semiconductor layer.

In this embodiment, since the high reflectivity is required, resistance of an element is reduced by forming lower DBR 202 with many laminations, and the upper DBR 207 with n type. Thereby, the power dissipation of VCSEL can be reduced.

Figure 17:
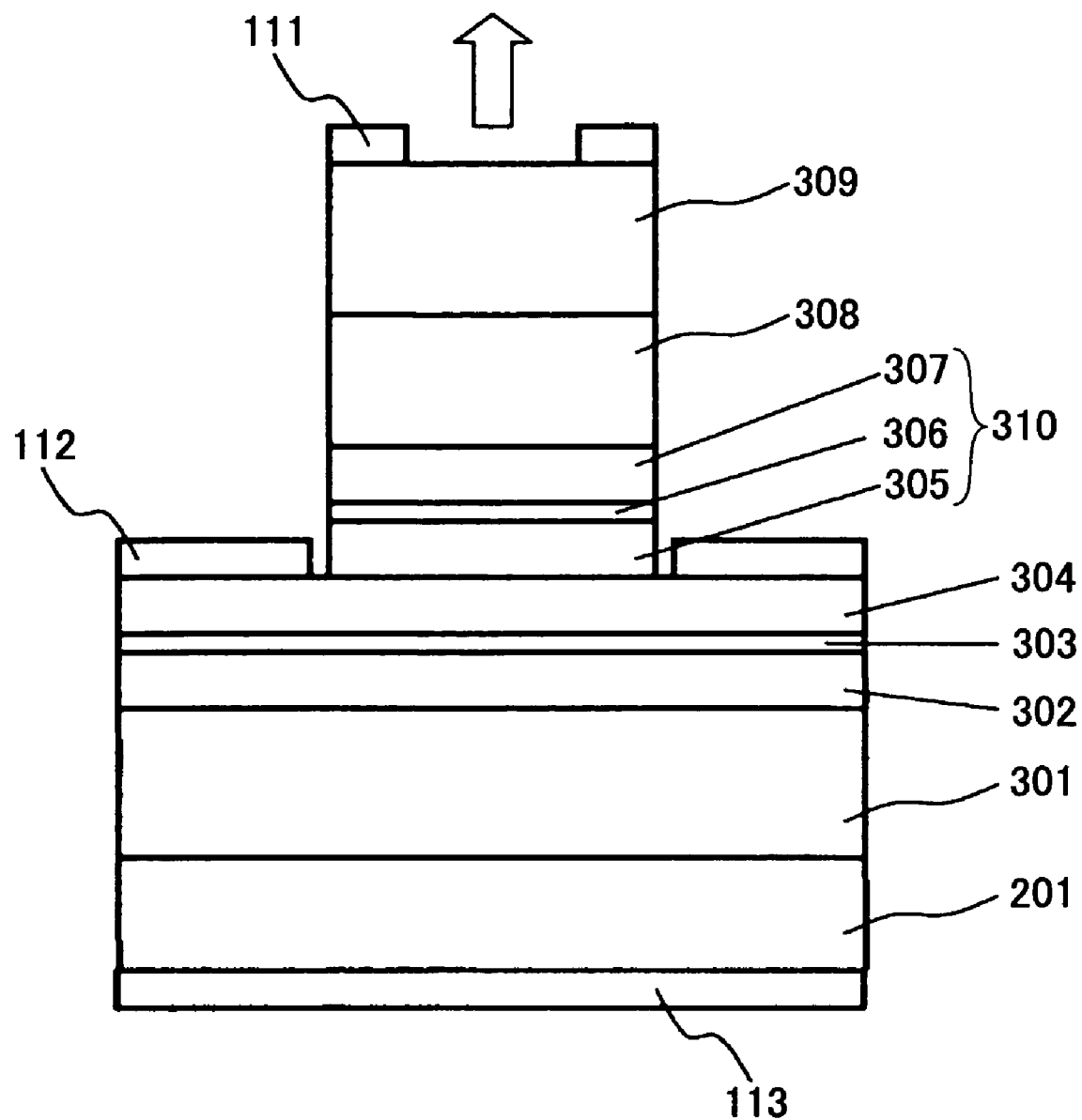
FIG. 17 is a diagram showing the composition of a vertical cavity surface-emitting laser device in another embodiment of the invention.

FIG. 17 shows the composition of a vertical cavity surface-emitting semiconductor laser device (VCSEL) in another embodiment of the invention.

In FIG. 17, the same polarity is given to the same part as FIG. 15 and FIG. 16.

Referring to FIG. 17, laminates n type lower distribution Bragg reflector (DBR) 301 on n type GaAs substrate 201. The n type lower DBR 301 laminates n type GaAs and 30.5 cycles of n type $Al_{0.9}Ga_{0.1}As$ alternately, and is formed. And on n type lower DBR 301, the 1st resonator of GaAs lower spacer layer 302, GaInAs/GaAs MQW active layer 303, the 1st resonator of p type GaAs the upper spacer layer 304, and the middle DBR 310 are laminated one by one.

The middle DBR 310 laminates GaAs and 9.5 cycles of $Al_{0.9}Ga_{0.1}As$ alternately, and is formed. And GaInAs/GaAs MQW optical absorption layer 306 is formed in the middle of the middle DBR 310. And in the middle DBR 310, the lower surface of the optical absorption layer 306 is the p type middle DBR 305, and the upper surface of the optical absorption layer 306 is the n type middle DBR 307.

On the n type middle DBR 307, the 2nd resonator spacer layer 308 of n type GaAs and upper DBR 309 are laminated.

The upper DBR 309 laminates n type GaAs and 15 cycles of n type $Al_{0.9}Ga_{0.1}As$ alternately, and is formed.

The region between the n type lower DBR 301 and the p type middle DBR 305 serves as the 1st resonator. The region between the n type middle DBR 307 and upper DBR 309 serves as the 2nd resonator.

In this embodiment, the 1st resonator and 2nd resonator were formed with an one wavelength resonator, the wavelength corresponding to the resonator length of the 1st resonator is 975 nm, and the wavelength corresponding to the resonator length of the 2nd resonator is 985 nm.

By the optical thickness with the wavelength of 980 nm of ¼, lower DBR 301, the middle DBR 305, 307, and the upper DBR 309 laminate a GaAs layer and an $Al_{0.9}Ga_{0.1}As$ layer alternately, and are formed.

The active layer 303 is formed so that it may be located in the center in the 1st resonator. The optical absorption layer 306 is formed so that it may be located in an equal distance from the upper end of the 1st resonator of p type GaAs the upper spacer layer 304, and the lower end of the 2nd resonator spacer layer 308 of n type GaAs.

Etching is performed from the above-mentioned lamination structure surface to the 1st resonator of p type GaAs the upper spacer layer 304, and the mesa structure is formed. And the 1st electrode 111 is formed in the upper DBR 309 surface except for the light emission part. The 2nd electrode 112 is formed on the 1st resonator of p type GaAs the upper spacer layer 304 at the bottom of the mesa structure. The 3rd electrode 113 is formed in the n type GaAs substrate 101 back surface.

In this embodiment, the two resonance wavelength which the 1st resonator and 2nd resonator coupled optically, and is formed is 972 nm and 988 nm. The active layer 303 set gain peak wavelength to 930 nm, and it produced it so that the resonance wavelength (972 nm) on the side of short wavelength and the resonance wavelength (988 nm) on the side of long wavelength might make the almost same gain.

The center wavelength of the high reflexogenic-zone region is 988 nm also about DBR, and it formed so that a reflectivity might become equivalent with the resonance wavelength (972 nm) on the side of short wavelength, and the resonance wavelength (988 nm) on the side of long wavelength.

However, since the resonator length of the 1st resonator is made shorter than the resonator length of the 2nd resonator, the rate of the light shut up by the 1st resonator increases in the resonance wavelength on the side of short wavelength.

On the other hand, the rate of the light shut up by the 2nd resonator increases in the resonance wavelength on the side of long wavelength. Since the active layer 303 is formed in the 1st resonator, it has an active layer light absorbing coefficient whose resonance wavelength on the side of short wavelength is higher than the resonance wavelength on the side of long wavelength. Thereby, when not applying an electric field to an optical absorption layer, the resonance wavelength on the side of short wavelength with a high active layer light absorbing coefficient has priority and oscillates among two resonance wavelength.

The optical absorption layer 306 is formed so that the absorption edge when not applying an electric field may be set to 950 nm, and it is transparent to two resonance wavelength.

By supplying the reverse bias between the 1st electrode 111 and the 2nd electrode 112, an electric field is applied to optical absorption layer 306, and the absorption edge of an optical absorption layer shifts to the about 40 nm long wavelength side according to the quantum confined Stark effect.

Thereby, the absorption coefficient increases optical absorption layer 306 to the two resonance wavelengths.

The optical absorption layer 306 is formed so that it may be located in an equal distance from the upper end of the 1st resonator of p type GaAs the upper spacer layer 304, and the lower end of the 2nd resonator spacer layer 308 of n type GaAs. And since the lamination periodicity number of the middle DBR 310 is constituted 9.5 cycles, it is located in the anti-node of the electric field intensity distribution inside VCSEL in the resonance wavelength on the side of short wavelength. On the other hand, it is located in the node of the electric field intensity distribution inside VCSEL in the resonance wavelength on the side of long wavelength.

Therefore, the optical absorption layer 306 has absorption to both the resonance wavelength on the side of long wavelength and the resonance wavelength on the side of short wavelength, if an electric field is applied, but since the resonance wavelength on the side of short wavelength of the rate coupled with the light inside VCSEL is larger, it serves as a large absorption loss to the resonance wavelength on the side of short wavelength. Thereby, the oscillation of the resonance wavelength on the side of short wavelength is suppressed.

If the oscillation of the resonance wavelength on the side of short wavelength is suppressed, the carrier currently consumed by the oscillation gain of the resonance wavelength on the side of short wavelength will decrease, and the gain to the resonance wavelength on the side of long wavelength will increase. Thereby, the laser light output intensity of the resonance wavelength on the side of long wavelength increases.

Therefore, the current introduced into an active layer is continuously introduced in with the steady value higher than laser oscillation threshold current, and switching operation of the oscillation wavelength of VCSEL can be carried out by modulating the electric field applied to the optical absorption layer between the resonance wavelength on the side of short wavelength, and the resonance wavelength on the side of long wavelength.

In this embodiment, as the optical absorption layer 306, GaInAs/GaAs MQW structure is used, and by an exciton being shut up by the GaInAs quantum well layer in this case, even when an electric field is applied, a steep optical absorption edge can be obtained compared with a bulk optical absorption layer. Therefore, when an electric field is applied to optical absorption layer 306, absorption coefficient change of an optical absorption layer can be enlarged.

Although the example using the GaInAs/GaAs multiple quantum well structure which includes strain in a well layer as an optical absorption layer explained in this embodiment, it is also possible to use the multiple quantum well structure which does not include strain, the distorted compensation structure where a well layer and a barrier layer have strain of a counter direction, and single quantum well structure.

Figure 18:
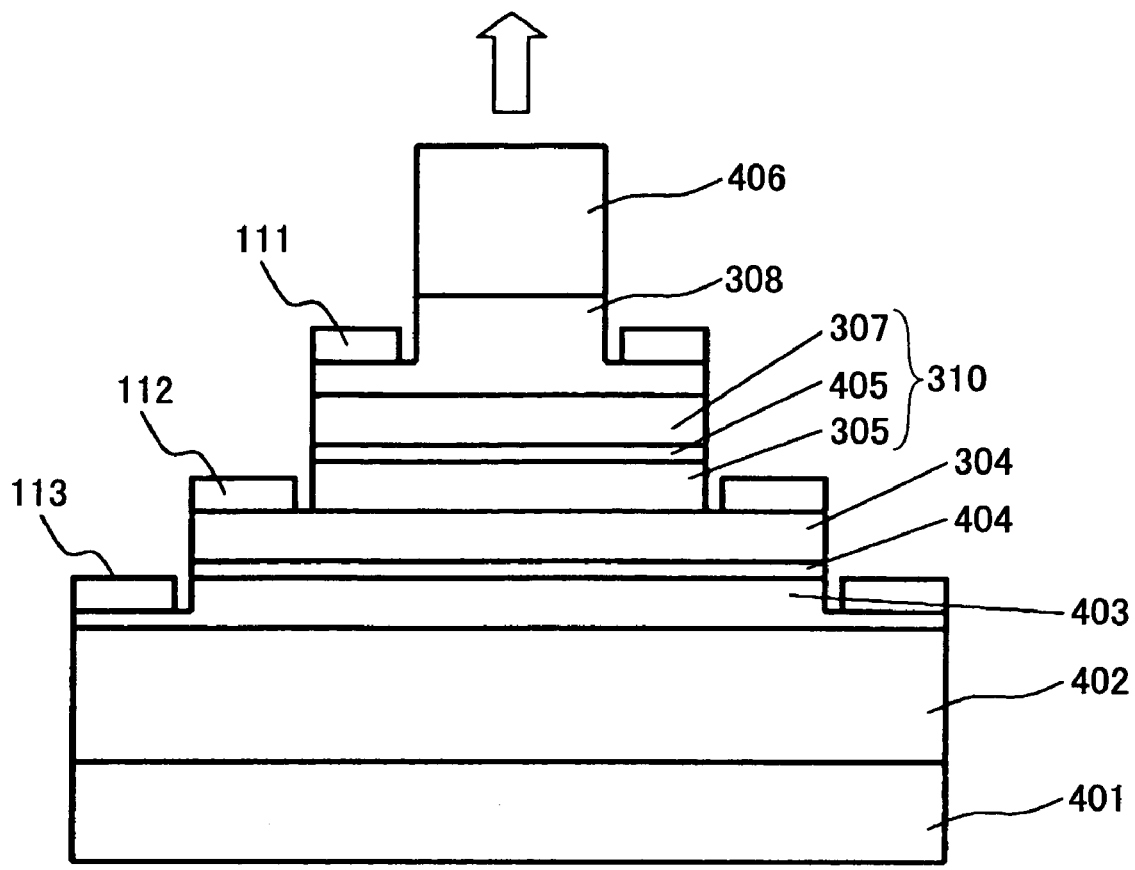
FIG. 18 is a diagram showing the composition of a vertical cavity surface-emitting laser device in another embodiment of the invention.

FIG. 18 shows the composition of a vertical cavity surface-emitting semiconductor laser device (VCSEL) in another embodiment of the invention.

In FIG. 18, the same polarity is given to the same part as FIG. 15 and FIG. 17. Reference of FIG. 18 laminates undoped lower distribution Bragg reflector (DBR) 402 on the undoped GaAs substrate 401.

The undoped lower DBR 402 laminates undoped GaAs and 35.5 cycles of undoped $Al_{0.9}Ga_{0.1}As$ alternately, and is formed. On lower DBR 402, the 1st resonator of n type GaAs lower spacer layer 403, GaInNAs/GaAs MQW active layer 404, and the 1st resonator of p type GaAs the upper spacer layer 304, and the middle DBR 310 are laminated one by one.

The middle DBR 310 laminates GaAs and 9.5 cycles of $Al_{0.9}Ga_{0.1}As$ alternately, and is formed. And GaInNAs/GaAs MQW optical absorption layer 405 is formed in the middle of the middle DBR 310. And in the middle DBR 310, the lower surface of optical absorption layer 405 is the p type middle DBR 305, and the upper surface of optical absorption layer 405 is the n type middle DBR 307.

On the n type middle DBR 307, the 2nd resonator spacer layer 308 of n type GaAs and undoped the upper DBR 406 are laminated. Here, undoped the upper DBR 406 laminates undoped GaAs and 18 cycles of undoped $Al_{0.9}Ga_{0.1}As$ alternately, and is formed.

The region between the undoped lower DBR 402 and the p type middle DBR 305 serves as the 1st resonator. The region between the n type middle DBR 307 and undoped the upper DBR 406 serves as the 2nd resonator.

In this embodiment, the 1st resonator and 2nd resonator are formed with an one wavelength resonator, and optical resonator length is made the same. For example, the wavelength corresponding to the optical distance of resonator length is 1300 nm.

By the optical thickness with the wavelength of 1300 nm of ¼, the lower DBR 402 and the middle DBR 305,307 laminate a GaAs layer and an $Al_{0.9}Ga_{0.1}As$ layer alternately, and form them. By the optical thickness with a wavelength of 1310 nm of ¼, the upper DBR 406 laminates a GaAs layer and an Al0.9Ga0.1As layer alternately, and forms them.

The active layer 404 is formed so that it may be located in the center in the 1st resonator. The optical absorption layer 405 is formed so that it may be located in an equal distance from the upper end of the 1st resonator of p type GaAs the upper spacer layer 304, and the lower end of the 2nd resonator spacer layer 308 of n type GaAs.

Etching is performed from the above-mentioned lamination structure surface to the 2nd resonator spacer layer 308 of n type GaAs, and the 1st mesa structure is formed. In larger size than the 1st mesa structure, it etches to the 1st resonator of p type GaAs the upper spacer layer 304, and the 2nd mesa structure is formed. In larger size than the 2nd mesa structure, it etches to the middle of the 1st resonator of n type GaAs lower spacer layer 403, and the 3rd mesa structure is formed.

And the 1st electrode 111 is formed on the 2nd resonator spacer layer 308 of n type GaAs at the 1st bottom of the mesa structure. The 2nd electrode 112 is formed on the 1st resonator of p type GaAs the upper spacer layer 304 at the 2nd bottom of the mesa structure. The 3rd electrode 113 is formed on the 1st resonator of n type GaAs lower spacer layer 403 at the 3rd bottom of the mesa structure.

In this embodiment, the two resonance wavelengths which the 1st resonator and the 2nd resonator coupled optically, and are formed is 1292 nm and 1315 nm. Therefore, the direction of the resonance wavelength (1292 nm) on the side of short wavelength is close to the center wavelength of 1300 nm of the high reflexogenic-zone region of DBR, and it has the reflection loss whose resonance wavelength (1292 nm) on the side of short wavelength is lower than the resonance wavelength (1315 nm) on the side of long wavelength.

Therefore, the VCSEL usually carries out the laser emission with the resonance wavelength (1292 nm) on the side of short wavelength.

The optical absorption layer 405 is formed so that the absorption edge when not applying an electric field may be set to 1260 nm, and it is transparent to two resonance wavelength. By supplying the reverse bias between the 1st electrode 111 and the 2nd electrode 112, an electric field is applied to optical absorption layer 405, and the absorption edge of an optical absorption layer 405 shifts to the about 60 nm long wavelength side according to the quantum confined Stark effect. Thereby, an absorption coefficient increases optical absorption layer 405 to two resonance wavelength.

The optical absorption layer 405 is formed so that it may be located in an equal distance from the upper end of the 1st resonator of p type GaAs the upper spacer layer 304, and the lower end of the 2nd resonator spacer layer 308 of n type GaAs. And since the lamination periodicity number of the middle DBR 310 is constituted 9.5 cycles, it is located in the anti-node of the electric field intensity distribution inside VCSEL in the resonance wavelength on the side of short wavelength.

On the other hand, it is located in the node of the electric field intensity distribution inside VCSEL in the resonance wavelength on the side of long wavelength. Therefore, optical absorption layer 405 has absorption to both the resonance wavelength on the side of long wavelength, and the resonance wavelength on the side of short wavelength, if an electric field is applied, but since the resonance wavelength on the side of short wavelength of the rate coupled with the light inside VCSEL is larger, it serves as a large absorption loss to the resonance wavelength on the side of short wavelength. Thereby, the oscillation of the resonance wavelength on the side of short wavelength is suppressed.

If the oscillation of the resonance wavelength on the side of short wavelength is suppressed, the carrier currently consumed by the oscillation gain of the resonance wavelength on the side of short wavelength will decrease, and the gain to the resonance wavelength on the side of long wavelength will increase. Thereby, the laser light output intensity of the resonance wavelength on the side of long wavelength increases. Therefore, the current introduced into an active layer is continuously introduced in with the steady value higher than laser oscillation threshold current, and switching operation of the oscillation wavelength of VCSEL can be carried out by modulating the electric field applied to the optical absorption layer between the resonance wavelength on the side of short wavelength, and the resonance wavelength on the side of long wavelength.

An increase of the carrier concentration of the semiconductor layer which constitutes DBR will increase the optical absorption by a free carrier. Furthermore, in addition to free carrier absorption, an increase of hole concentration will increase absorption between valence bands, and the optical absorption by the Auger recombination by a p type semiconductor layer.

In this embodiment, since the lower DBR 402 and the upper DBR 406 are constituted from a undoped layer, the carrier concentration of DBR can be reduced to below $1 \times 10^{17}$ $cm^{-3}$. Therefore, the internal absorption loss of VCSEL can be reduced effectively and the reduction in threshold current and the improvement in external quantum efficiency are attained.

GaInNAs which is a mixed-crystal semiconductor containing nitrogen and other V group elements is used for active layer 404 as a well layer. Since GaInNAs material has a band gap of a 1.3-1.6 micrometer long wavelength region suitable for transmission of silica optical fiber, and a conduction band electron with a GaAs barrier layer shuts it up and it can make barrier height high with 300 meV or more. The electronic overflow from an active layer is suppressed and it has good temperature characteristics.

Since it can be made to grow epitaxially on a GaAs substrate, GaAs/AlGaAs system DBR which is a high reflectivity as a multilayer film reflector, and is excellent in thermal conductivity can be used. Therefore, highly efficient long wavelength region VCSEL can be formed.

The distribution of silica optical fiber can operate the VCSEL on the wavelength of about 1.31 micrometers which is zero.

In this embodiment, although the wavelength modulation of VCSEL are carried out between two wavelengths, signal degradation by the wavelength dispersion after silica-optical-fiber transmission can be suppressed by using a 1.3-micrometer band with small wavelength dispersion.

Figure 19:
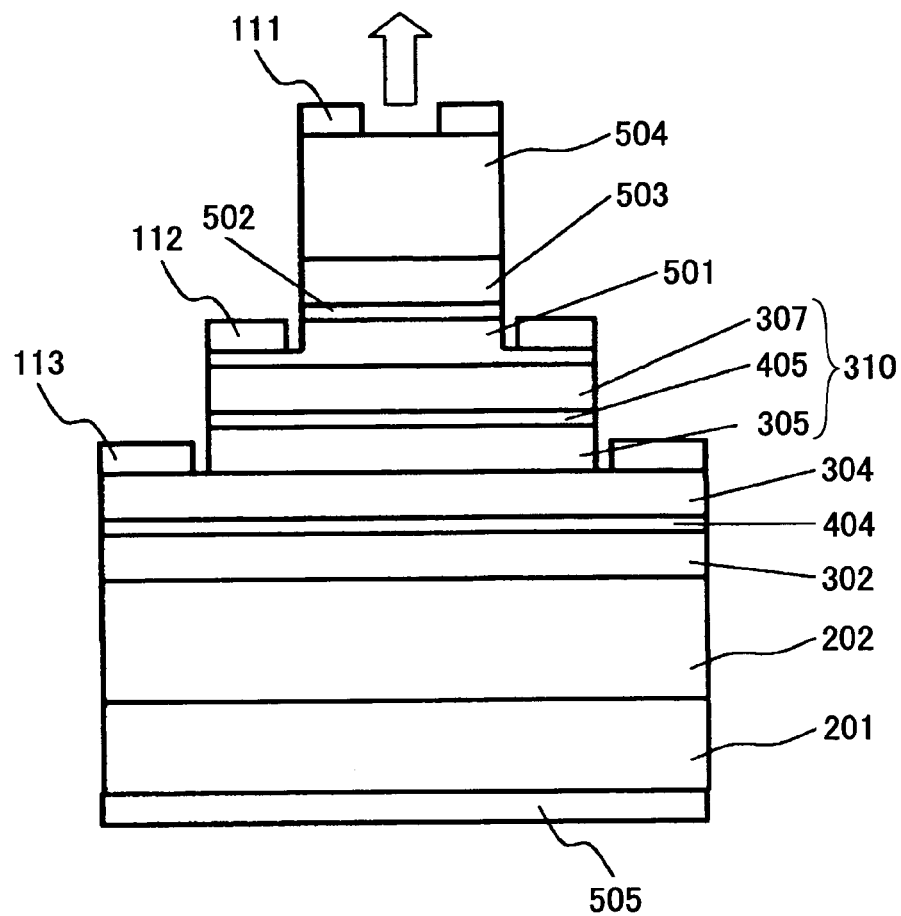
FIG. 19 is a diagram showing the composition of a vertical cavity surface-emitting laser device in another embodiment of the invention.

FIG. 19 shows the composition of a vertical cavity surface-emitting semiconductor laser device (VCSEL) in another embodiment of the invention.

In FIG. 19, the same polarity is given to the same part as FIG. 15, FIG. 17, and FIG. 18.

Referring to FIG. 19, laminates n type lower distribution Bragg reflector (DBR) 301 on n type GaAs substrate 201. The n type lower DBR 301 laminates n type GaAs and 35.5 cycles of n type Al0.9Ga0.1As alternately, and is formed. And on n type lower DBR 301, the 1st resonator of GaAs lower spacer layer 302, the 1st active layer 404 of GaInNAs/GaAs MQW, the 1st resonator of p type GaAs the upper spacer layer 304, and the middle DBR 310 are laminated one by one.

The middle DBR 310 laminates GaAs and 9.5 cycles of Al0.9Ga0.1As alternately, and is formed. GaInNAs/GaAs MQW optical absorption layer 405 is formed in the middle of the middle DBR 310. And in the middle DBR 310, the lower surface of optical absorption layer 405 is the p type middle DBR 305, and the upper surface of optical absorption layer 405 is the n type middle DBR 307.

On the n type middle DBR 307, the 2nd resonator of n type GaAs lower spacer layer 501, the 2nd active layer 502 of GaInNAs/GaAs MQW, the 2nd resonator of p type GaAs lower spacer layer 503, and the p type upper DBR 504 are laminated.

The p type upper DBR 504 laminates p type GaAs and 18 cycles of p type Al0.9Ga0.1As alternately, and is formed. The region between the n type lower DBR 301 and the p type middle DBR 305 serves as the 1st resonator. The region between the n type middle DBR 307 and the p type upper DBR 504 serves as the 2nd resonator.

In this embodiment, the 1st resonator and the 2nd resonator are formed with a one wavelength resonator, and the optical resonator length is made the same.

For example, the wavelength corresponding to the optical distance of resonator length is 1300 nm. By the optical thickness with a wavelength of 1300 nm of ¼, lower DBR 301, the middle DBR 305, 307, and the upper DBR 504 laminate a GaAs layer and an Al0.9Ga0.1As layer alternately, and form them.

The 1st active layer 404 is formed so that it may be located in the center in the 1st resonator. The 2nd active layer 503 is formed so that it may be located in the center in the 2nd resonator.

The optical absorption layer 405 is formed so that it may be located in an equal distance from the upper end of the 1st resonator of p type GaAs the upper spacer layer 304, and the lower end of the 2nd resonator of n type GaAs lower spacer layer 501.

Etching is performed from the above-mentioned lamination structure surface to the 2nd resonator of n type GaAs lower spacer layer 501, and the 1st mesa structure is formed. In larger size than the 1st mesa structure, it etches to the 1st resonator of p type GaAs the upper spacer layer 304, and the 2nd mesa structure is formed.

And on the p type upper DBR 504 of the 1st mesa structure apex part, the 1st electrode 111 is formed except for the light emission part. The 2nd electrode 112 is formed on the 2nd resonator of n type GaAs lower spacer layer 501 at the 1st bottom of the mesa structure. The 3rd electrode 113 is formed on the 1st resonator of p type GaAs the upper spacer layer 304 at the 2nd bottom of the mesa structure. The 4th electrode 505 is formed in the n type GaAs substrate 201 back surface.

In this embodiment, the two resonance wavelengths which the 1st resonator and the 2nd resonator coupled optically, and is formed is 1289 nm and 1312 nm.

The active layer 404,502 is formed so that gain peak wavelength may be set to 1290 nm, and its gain is higher than the resonance wavelength (1312 nm) on the side of long wavelength at the resonance wavelength (1289 nm) on the side of short wavelength. Therefore, the VCSEL usually carries out the laser emission with the resonance wavelength (1289 nm) on the side of short wavelength.

The optical absorption layer 405 is formed so that the absorption edge when not applying an electric field may be set to 1260 nm, and it is transparent to two resonance wavelength. By supplying the reverse bias between the 1st electrode 111 and the 2nd electrode 112, an electric field is applied to optical absorption layer 405, and the absorption edge of an optical absorption layer shifts to the about 60 nm long wavelength side according to the quantum confined Stark effect. Thereby, an absorption coefficient increases optical absorption layer 405 to the two resonance wavelengths.

The optical absorption layer 405 is formed so that it may be located in an equal distance from the upper end of the 1st resonator of p type GaAs the upper spacer layer 304, and the lower end of the 2nd resonator of n type GaAs lower spacer layer 501. And since the lamination periodicity number of the middle DBR 310 is constituted 9.5 cycles, it is located in the anti-node of the electric field intensity distribution inside VCSEL in the resonance wavelength on the side of short wavelength.

On the other hand, it is located in the node of the electric field intensity distribution inside VCSEL in the resonance wavelength on the side of long wavelength. Therefore, optical absorption layer 405 has absorption to both the resonance wavelength on the side of long wavelength, and the resonance wavelength on the side of short wavelength, if an electric field is applied, but since the resonance wavelength on the side of short wavelength of the rate coupled with the light inside VCSEL is larger, it serves as a large absorption loss to the resonance wavelength on the side of short wavelength. Thereby, the oscillation of the resonance wavelength on the side of short wavelength is suppressed.

If the oscillation of the resonance wavelength on the side of short wavelength is suppressed, the carrier currently consumed by the oscillation gain of the resonance wavelength on the side of short wavelength will decrease, and the gain to the resonance wavelength on the side of long wavelength will increase. Thereby, the laser light output intensity of the resonance wavelength on the side of long wavelength increases. Therefore, the current introduced into an active layer is continuously introduced in with the steady value higher than laser oscillation threshold current, and switching operation of the oscillation wavelength of the VCSEL can be carried out by modulating the electric field applied to the optical absorption layer between the resonance wavelength on the side of short wavelength, and the resonance wavelength on the side of long wavelength.

The VCSEL of this embodiment has an active layer in both the 1st resonator and the 2nd resonator. Although the two active layers 404, 502 are formed in a different resonator, the 1st resonator and 2nd resonator are coupled optically and both two active layers have gain to two resonance wavelength. Therefore, the mode locking of the oscillation light when carrying out current introducing is carried out to the active layer provided in the oscillation light when carrying out current introducing, and the 2nd resonator at the active layer provided in the 1st resonator.

Since the photon density generated in the 2nd active layer carries out mode locking to the photon density which carries out current introducing and which is generated in one active layer and applied to it by this, the photon density inside a VCSEL element can be made to increase. Thereby, the switching speed between the resonance wavelength on the side of short wavelength and the resonance wavelength on the side of long wavelength can be raised further.

In the VCSEL of each of the above-mentioned embodiments, the current confinement unit against an active layer is not shown. it is possible Al oxidization confinement structure which oxidized alternatively the layer containing Al from the side as a current confinement unit against an active layer, the air gap structure which carried out side etching of the specific semiconductor layer alternatively from the side, the high resistance region made of ion implantation, and to use tunnel junction etc.

Figure 20:
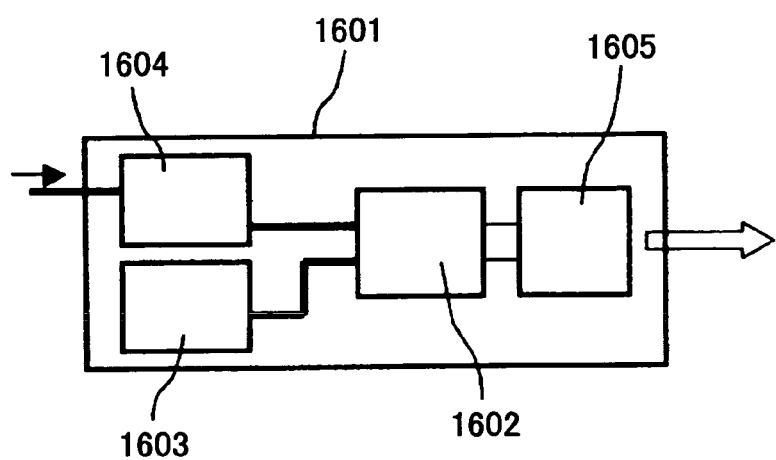
FIG. 20 is a diagram showing the composition of an optical transmission module in another embodiment of the invention.

FIG. 20 shows the composition of an optical transmission module in another embodiment of the invention.

Referring to FIG. 20, the vertical cavity surface-emitting semiconductor laser device (VCSEL) of any of the above embodiments is used as the light source 1602 in the optical transmission module 1601.

The direct current power supply 1603 introduces the fixed current into the active layer of the VCSEL 1602, and the laser emission is carried out. The modulation bias power supply 1604 modulates the electric field applied to the optical absorption layer of VCSEL 1602 according to the electric signal inputted from the outside. Thereby, the oscillation wavelength of the VCSEL can be modulated.

Only the specific wavelength as which the laser light outputted from VCSEL 1602 is chosen by the wavelength selection unit 1605 is outputted outside. Thereby, a wavelength modulating signal is converted into a light intensity modulating signal. It is formed in this embodiment, using a dielectric multilayer film filter as the wavelength selection unit 1605.

Thereby, the laser light output intensity can be modulated at high speed by carrying out the direct voltage drive of the VCSEL at 40 Gbps per single channel. Therefore, the module size is small and the optical transmission module of low cost can be offered.

Figure 21:
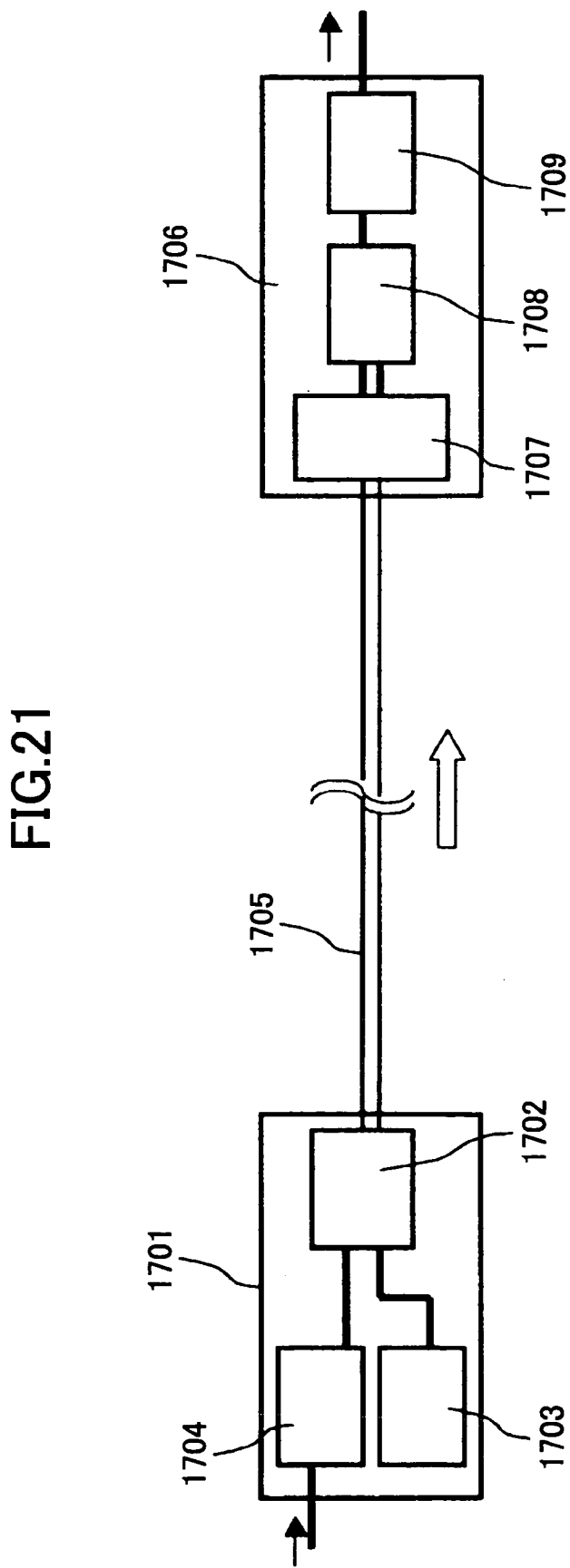
FIG. 21 is a diagram showing the composition of an optical transmission device in another embodiment of the invention.

FIG. 21 shows the composition of an optical transmission device in another embodiment of the invention.

Referring to FIG. 21, in the optical transmission unit 1701, the electric signal is converted into a light signal and is introduced into the optical fiber cable 1705. The light which is guided via the optical fiber cable 1705 is again converted and outputted to the electric signal in the optical receiving unit 1706.

In the optical transmission unit 1701, the vertical cavity surface-emitting semiconductor laser device (VCSEL) of the embodiment of FIG. 18 is used as the light source 1702. The direct current power supply 1703 introduces the fixed current into the active layer of VCSEL 1702, and the laser emission is carried out.

The modulation bias power supply 1704 modulates the electric field applied to the optical absorption layer of the VCSEL 1702 according to the electric signal inputted into the optical transmission unit from the outside. Thereby, the high-speed modulation of the oscillation wavelength of VCSEL can be carried out with the data-transmission capacity of 40 Gbps per single channel.

In the optical receiving unit 1706, the light signal outputted from the optical fiber cable 1705 is separated for every wavelength by the wavelength selection unit 1707, and the specific selected wavelength is received by the photo detector 1708.

A wavelength modulating signal is converted into a light intensity modulating signal by passing along the wavelength selection unit 1707. The conversion of the light signal received by the photo detector 1708 into the current, the signal amplification, the waveform shaping, etc. are performed by the receiving circuit 1709, and the resulting signal is outputted outside from the optical receiving unit 1706.

As the wavelength selection unit 1707, it is possible to use a multilayer film filter, resonator structure, a diffraction grating, an interferometer, etc. Although the wavelength selection unit 1707 is formed in the optical receiving unit 1706 in this embodiment just before photo detector 1708. It is also possible to provide the same in the middle of the optical fiber cable 1705 between the VCSEL 1702 in the optical transmission unit 1701 and the optical fiber cables 1705.

Since the vertical cavity surface-emitting semiconductor laser device (VCSEL) of FIG. 18 is used for the optical transmission device of this embodiment as the light source of the optical transmission unit 1701, 40 Gbps light signal transmission is possible for it, without using an external modulator. Therefore, the module size can be reduced, and the manufacture with a low cost can be realized.

Since the voltage drive of the modulation of the VCSEL is carried out, compared with the current drive, the power consumption can be reduced.

Figure 22:
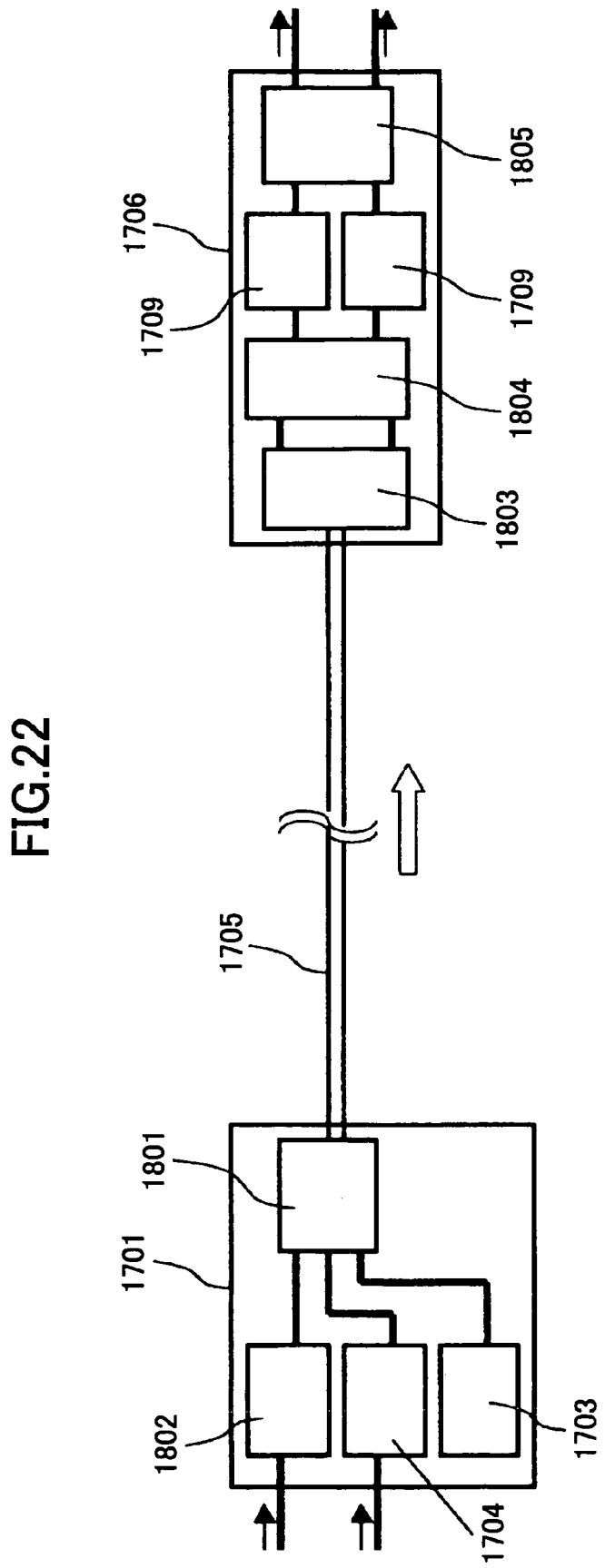
FIG. 22 is a diagram showing the composition of an optical transmission device in another embodiment of the invention.

FIG. 22 shows the composition of an optical transmission device in another embodiment of the invention.

Referring to FIG. 22, in the optical transmission unit 1701, the electric signal is converted into a light signal and is introduced into the optical fiber cable 1705. The light which is guided along the optical fiber cable 1705 is again converted and outputted to the electric signal by the optical receiving unit 1706.

In the optical transmission unit 1701, the vertical cavity surface-emitting semiconductor laser device (VCSEL) of FIG. 19 is used as the light source 1801. The direct current power supply 1703 introduces the fixed current into the 1st active layer of the VCSEL 1801, and the laser emission is carried out.

The modulation bias power supply 1704 modulates the electric field applied to the optical absorption layer of the VCSEL 1801 according to the electric signal inputted into the optical transmission unit 1701 from the outside. Thereby, the oscillation wavelength of the VCSEL can be modulated at 40 Gbps.

The current drive circuit 1802 modulates the current introduced into the 2nd active layer of VCSEL 1801 according to the electric signal inputted from the outside. Therefore, independently of the modulation of the oscillation wavelength, the light intensity can be simultaneously modulated at 20 Gbps according to the current introduced into the 2nd active layer.

In the optical receiving unit 1706, the light signal outputted from the optical fiber cable 1705 is divided into two wavelengths by the optical branch unit 1803, and the light is received by the photo detector array 1804. The light signal of each wavelength separated by passing along the optical branch unit 1803 is inputted into a respectively separate photo detector, and is converted into the electric signal.

And signal amplification, waveform shaping, etc. are performed by the receiving circuit 1709, and it is inputted into the computation unit 1805.

In the computation unit 1805, the signal which received light by photo detector array 1804 is divided into a wavelength modulation code and an intensity modulation sign, a sign is reproduced, and it outputs outside. Thereby, the optical signal can be transmitted at 60 Gbps per channel and it is possible to increase the data transmission capacity further.

The present invention is applicable for optical fiber communication systems, optical interconnection systems, etc.

The present invention is not limited to the above-described embodiments, and variations and modifications may be made without departing from the scope of the present invention.

Further, the present application is based on and claims the benefit of priority of Japanese patent application No. 2005-026469, filed on Feb. 2, 2005, and Japanese patent application No. 2005-062294, filed on Mar. 7, 2005, the entire contents of which are hereby incorporated by reference.

What is claimed is:

1. A vertical cavity surface-emitting semiconductor laser device including a first semiconductor multilayer film reflector, a first resonator, a second semiconductor multilayer film reflector, a second resonator, and a third semiconductor multilayer film reflector which are provided on a substrate, the vertical cavity surface-emitting semiconductor laser device comprising:

an active layer provided in one of the first resonator and the second resonator;

an optical absorption layer provided in the other of the first resonator and the second resonator;

a current introducing unit introducing a current to the active layer; and an electric field applying unit applying an electric field to the optical absorption layer, wherein first and second resonance wavelengths are emitted while the first resonator and the second resonator are coupled optically, the first resonance wavelength being shorter than the second resonance wavelength, and wherein a gain of the active layer at the first resonance wavelength is higher than that at the second resonance wavelength, wherein an absorption coefficient of the optical absorption layer when no electric field is applied is small for the first and second resonance wavelengths, and when an electric field is applied, an absorption coefficient of the optical absorption layer for the first resonance wavelength is larger than that for the second resonance wavelength.

2. A vertical cavity surface-emitting semiconductor laser device including a first semiconductor multilayer film reflector, a first resonator, a second semiconductor multilayer film reflector, a second resonator, and a third semiconductor multilayer film reflector which are provided on a substrate, the vertical cavity surface-emitting semiconductor laser device comprising:

an active layer provided in one of the first resonator and the second resonator;

an optical absorption layer provided in the other of the first resonator and the second resonator;

a current introducing unit introducing a current to the active layer; and an electric field applying unit applying an electric field to the optical absorption layer, wherein first and second resonance wavelengths are emitted while the first resonator and the second resonator are coupled optically, the first resonance wavelength being shorter than the second resonance wavelength, and wherein a reflection loss at the first resonance wavelength is smaller than that at the second resonance wavelength, wherein an absorption coefficient of the optical absorption layer when no electric field is applied is small for the first and second resonance wavelengths, and when an electric field is applied, an absorption coefficient of the optical absorption layer for the first resonance wavelength is larger than that for the second resonance wavelength.

3. The vertical cavity surface-emitting semiconductor laser device according to claim 1 wherein the optical absorption layer is made of a multiple quantum well structure.

4. The vertical cavity surface-emitting semiconductor laser device according to claim 1 wherein the first semiconductor multilayer film reflector and the third semiconductor multilayer film reflector are of n type, and the second semiconductor multilayer film reflector is of p type.

5. The vertical cavity surface-emitting semiconductor laser device according to claim 1 wherein the first semiconductor multilayer film reflector and the third semiconductor multilayer film reflector are made of a low carrier concentration layer.

6. The vertical cavity surface-emitting semiconductor laser device according to claim 1 further comprising a current confinement unit which confines the current introduced into the active layer, and a high resistance region which surrounds a circumference of a conductive part in a region where the electric field is applied to the optical absorption layer.

7. The vertical cavity surface-emitting semiconductor laser device according to claim 6 wherein the current confinement unit is provided to have different refractive indexes in a horizontal transverse direction, and the high resistance region in the region where the electric field is applied to the optical absorption layer is formed by ion implantation.

8. The vertical cavity surface-emitting semiconductor laser device according to claim 1 wherein the active layer and the optical absorption layer are made of a mixed-crystal semiconductor containing nitrogen and other V group elements in the periodic table.

9. The vertical cavity surface-emitting semiconductor laser device according to claim 1 further comprising a wavelength sweep mechanism which sweeps the first and second resonance wavelengths.

10. An optical transmitting module including the vertical cavity surface-emitting semiconductor laser device according to claim 1, the optical transmission module comprising a wavelength selecting unit selecting one of the first and second resonance wavelengths for a laser light emitted by the vertical cavity surface-emitting semiconductor laser device.

11. An optical transmission device including the vertical cavity surface-emitting semiconductor laser device according to claim 1, the optical transmission device comprising:

an optical fiber through which a laser light signal emitted by the vertical cavity surface-emitting semiconductor laser device is transmitted;

a wavelength selecting unit selecting one of the first and second resonance wavelengths for the laser light signal emitted by the vertical cavity surface-emitting semiconductor laser device; and a photodetector receiving the selected one of the first and second resonance wavelengths of the laser light signal from the wavelength selecting unit.

12. An optical switching method for use in the vertical cavity surface-emitting semiconductor laser device according to claim 1, the optical switching method comprising the steps of:

outputting a laser light with the first resonance wavelength while no electric field is applied to the optical absorption layer;

outputting a laser light with the second resonance wavelength while the electric field is applied to the optical absorption layer; and switching one of the first resonance wavelength and the second resonance wavelength for the laser light output from the vertical cavity surface-emitting semiconductor laser device.

13. An optical switching method for use in the vertical cavity surface-emitting semiconductor laser device according to claim 2, the optical switching method comprising the steps of:

outputting a laser light with the first resonance wavelength while no electric field is applied to the optical absorption layer;

outputting a laser light with the second resonance wavelength while the electric field is applied to the optical absorption layer; and switching one of the first resonance wavelength and the second resonance wavelength for the laser light output from the vertical cavity surface-emitting semiconductor laser device.

* * * * *